US011701785B2

(12) United States Patent
Yamaguchi et al.

(10) Patent No.: US 11,701,785 B2
(45) Date of Patent: *Jul. 18, 2023

(54) SUBSTRATE TRANSPORT WITH MOBILE BUFFER

(71) Applicant: KABUSHIKI KAISHA YASKAWA DENKI, Kitakyushu (JP)

(72) Inventors: Go Yamaguchi, Fukuoka (JP); Hiromitsu Akae, Fukuoka (JP); Kensuke Oni, Fukuoka (JP); Osamu Komiyaji, Fukuoka (JP)

(*) Notice: Subject to any disclaimer, the term of this patent is extended or adjusted under 35 U.S.C. 154(b) by 29 days.

This patent is subject to a terminal disclaimer.

(21) Appl. No.: 17/557,044

(22) Filed: Dec. 21, 2021

(65) Prior Publication Data
US 2022/0111539 A1    Apr. 14, 2022

Related U.S. Application Data

(63) Continuation of application No. PCT/JP2020/020197, filed on May 21, 2020.

(51) Int. Cl.
*B25J 15/00* (2006.01)
*B25J 9/00* (2006.01)
(Continued)

(52) U.S. Cl.
CPC ......... *B25J 15/0095* (2013.01); *B25J 9/0045* (2013.01); *B25J 11/0095* (2013.01); *B25J 15/04* (2013.01); *B25J 21/005* (2013.01)

(58) Field of Classification Search
CPC ...... B25J 15/0095; B25J 15/04; B25J 9/0045; B25J 11/0095; B25J 21/005
See application file for complete search history.

(56) References Cited

U.S. PATENT DOCUMENTS 7,067,018 B2 * 6/2006 Davis ............... H01L 21/67781
414/416.11
9,443,749 B2 * 9/2016 Wakabayashi .... H01L 21/67196
(Continued)

FOREIGN PATENT DOCUMENTS

JP   2003-197709          7/2003
JP   2003197709 A  *  7/2003  ....... H01L 21/67173
(Continued)

OTHER PUBLICATIONS

International Search Report dated Jul. 28, 2020 for PCT/JP2020/020197.
(Continued)

*Primary Examiner* — Gerald McClain
(74) *Attorney, Agent, or Firm* — Soei Patent & Law Firm

(57) ABSTRACT

A transport device in a transport chamber having a reduced pressure atmosphere and including a sidewall extending along an arrangement direction. The transport device includes a first robot fixed at a first robot position in the transport chamber and configured to transfer a substrate to and from a first chamber provided outside the transport chamber, and a second robot fixed at a second robot position in the transport chamber and configured to transfer the substrate to and from a second chamber provided outside the transport chamber on the sidewall. Additionally, the transport device includes a mobile buffer configured to hold the substrate and move along a movement locus extending along the arrangement direction and located between the sidewall and each of the first robot position and the second robot position. The movement locus includes a first position for transferring the substrate to and from the first robot and a second position for transferring the substrate to and from the second robot.

28 Claims, 20 Drawing Sheets

(51) Int. Cl.
*B25J 11/00* (2006.01)
*B25J 15/04* (2006.01)
*B25J 21/00* (2006.01)

(56) References Cited

U.S. PATENT DOCUMENTS

| | | | |
|---|---|---|---|
| 10,283,390 B2 * | 5/2019 | Kim | H01L 21/67742 |
| 11,417,550 B2 * | 8/2022 | Komiyaji | H01L 21/67769 |
| 2003/0185655 A1 | 10/2003 | Uchimaki et al. | |
| 2005/0087300 A1 * | 4/2005 | Ishizawa | H01L 21/67745 |
| | | | 156/345.31 |
| 2006/0045664 A1 * | 3/2006 | Niewmierzycki | |
| | | | H01L 21/67742 |
| | | | 414/217 |
| 2013/0302115 A1 * | 11/2013 | Wakabayashi | H01L 21/67703 |
| | | | 414/217 |
| 2014/0072397 A1 | 3/2014 | Mooring | |
| 2016/0351430 A1 * | 12/2016 | Kim | H01L 21/67173 |
| 2021/0242052 A1 * | 8/2021 | Komiyaji | H01L 21/68707 |
| 2022/0310423 A1 * | 9/2022 | Komiyaji | H01L 21/67748 |

FOREIGN PATENT DOCUMENTS

| | | |
|---|---|---|
| JP | 2003-282669 | 10/2003 |
| JP | 2008-028179 | 2/2008 |
| JP | 2008-510317 | 4/2008 |
| JP | 2014-068009 | 4/2014 |
| JP | 2014-216519 | 11/2014 |
| WO | 2006/023326 | 3/2006 |

OTHER PUBLICATIONS

International Preliminary Report on Patentability with Written Opinion dated Dec. 1, 2022 for PCT/JP2020/020197.

* cited by examiner

SUBSTRATE TRANSPORT WITH MOBILE BUFFER

CROSS-REFERENCE TO RELATED APPLICATIONS

This application is a continuation application of PCT Application No. PCT/JP2020/020197, filed on May 21, 2020, the entire contents of which are incorporated herein by reference.

BACKGROUND

Field

The present disclosure relates to a transport device, a transport method, and a transport system.

Description of the Related Art

Japanese Unexamined Patent Publication No. 2008-28179 discloses a substrate processing apparatus in which a substrate is transported to a plurality of processing chambers provided on a sidewall of a transport chamber by a movable robot that moves in the transport chamber by being driven by a linear motor.

SUMMARY

An example transport device disclosed herein is provided in a transport chamber having a reduced pressure atmosphere and including a sidewall extending along an arrangement direction. The transport device includes a first robot, a second robot, and a mobile buffer. The first robot is fixed at a first robot position in the transport chamber and configured to transfer a substrate to and from a first chamber provided around the transport chamber. The second robot is fixed at a second robot position in the transport chamber and configured to transfer the substrate to and from a second chamber provided around the transport chamber on the sidewall. The mobile buffer is configured to: hold the substrate; and move along a movement locus extending along the arrangement direction and located between the sidewall and each of the first robot position and the second robot position, wherein the movement locus includes a first position for transferring the substrate to and from the first robot and a second position for transferring the substrate to and from the second robot.

DETAILED DESCRIPTION

In the following description, with reference to the drawings, the same reference numbers are assigned to the same components or to similar components having the same function, and overlapping description is omitted.

In the following description, expressions such as "orthogonal", "horizontal", "vertical", "parallel", "center", and "symmetric" are used, but it is not necessary to strictly satisfy these states. That is, each of the expressions described above allows deviations in manufacturing accuracy, installation accuracy, processing accuracy, detection accuracy, and the like.

Figure 1:
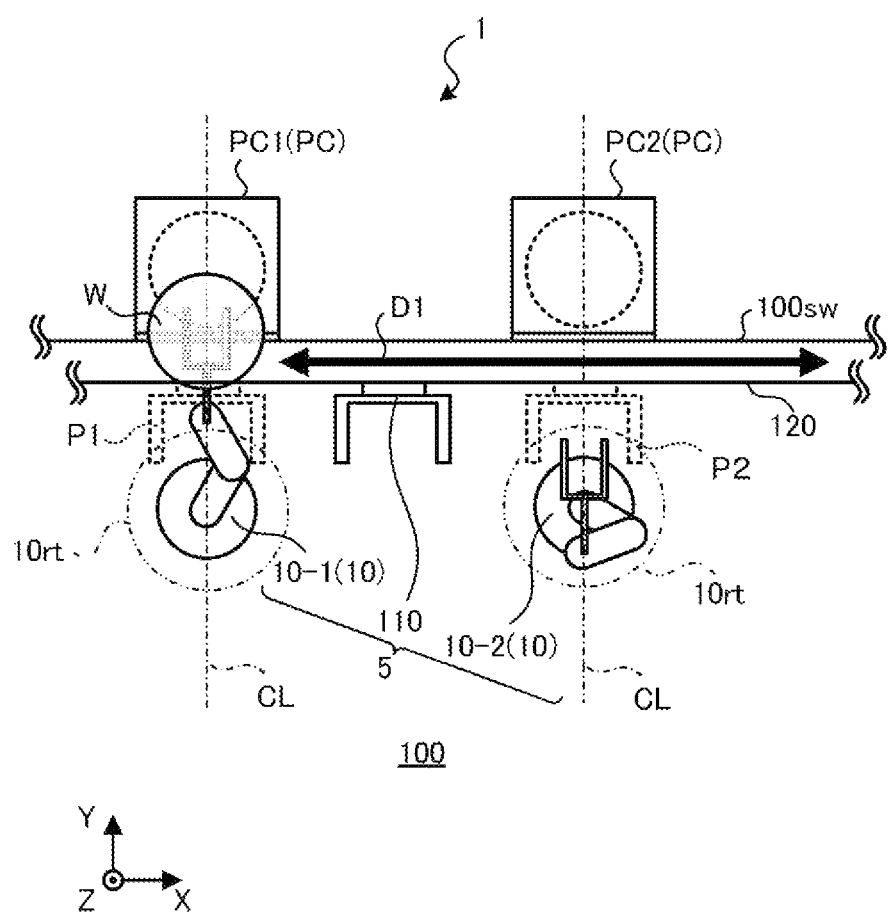
FIG. 1 is a schematic top view illustrating an example transport system.

First, an example transport system 1 will be described with reference to FIG. 1. FIG. 1 is a top view schematically illustrating the transport system 1 as viewed from above.

FIG. 1 shows a three-dimensional orthogonal coordinate system in which a Z-axis is defined as a positive direction in a vertically upward direction, an X-axis is defined as a direction along a sidewall 100sw of a transport chamber 100, and a Y-axis is defined as a normal direction of the sidewall 100sw, for ease of explanation. The sidewall 100sw is provided with plurality of processing chambers PC. The orthogonal coordinate system is also used in other drawings herein. FIG. 1 shows a center line CL corresponding to the front of a processing chamber PC. The center line CL is a normal line of the sidewall 100sw, and corresponds to a line (a line along the Y-axis in FIG. 1) passing through the center of a substrate W (see dashed circle) in the processing chamber PC.

As shown in FIG. 1, outside the transport chamber 100, the sidewall 100sw is provided with the plurality of processing chambers PC that performs processing on the substrate W in a reduced-pressure atmosphere. Here, the processing performed on the substrate W by the processing chamber PC includes film forming processing such as CVD (Chemical Vapor Deposition) and etching processing. In general, the environment of the reduced-pressure atmosphere may be referred to as a "vacuum" or a "partial vacuum". The side of the double line in the processing chamber PC shown in FIG. 1 corresponds to an opening that can be opened and closed.

Like the processing chamber PC, the transport chamber 100 has a reduced-pressure atmosphere in the room, and a plurality of robots 10 and a mobile buffer 110 are disposed in the room, and the transport unit transports the substrate W by cooperation of one or more units. A robot 10 is a substrate transport mechanism that transports the substrate \V such as putting the substrate W into the processing chamber PC or taking out the substrate W from the processing chamber PC, and is, for example, a horizontal articulated robot (scalar robot).

In some examples, the robot 10 is a "fixed robot" fixed to a floor wall 100f (see FIG. 4) of the transport chamber 100 or the like, and is different from a "mobile robot" that travels or moves in a room of the transport chamber 100. As described above, since the robot 10 does not move in the room of the transport chamber 100, it is easy to supply power to the robot 10, which contributes to a clean working environment of the transport chamber 100.

Hereinafter, the processing chamber PC closest to a load lock chamber LL (see FIG. 2A, etc.) provided in the sidewall 100sw of the transport chamber 100 is referred to as a first processing chamber PC1, and the processing chamber PC other than the first processing chamber PC1 is referred to as a second processing chamber PC2. In addition, in the following description, the robot 10 closest to the load lock chamber LL is referred to as "a first robot 10-1", and the robot 10 fixed in a position suitable for transferring the substrate W to and from at least one second processing chamber PC2 is referred to as "a second robot 10-2". FIG. 1 shows a turning region 10rt (circular region) corresponding to the minimum turning radius of the robot 10. The first robot 10-1 is fixed at a first robot position in the transport chamber 100 and configured to transfer the substrate W to and from a first chamber provided around the transport chamber 100. The first chamber may be the load lock chamber LL or the first processing chamber PC1. The second robot 10-2 is fixed at a second robot position in the transport chamber 100 and configured to transfer the substrate to and from a second chamber provided around the transport chamber on the sidewall 100sw. The second chamber may be the second processing chamber PC2.

The mobile buffer 110 is a buffer for temporarily holding the substrate W, and moves in a horizontal orientation D1 along the sidewall 100sw (or along an arrangement direction) between the sidewall 100sw and the robot 10 (each of the first robot position and the second robot position). For example, the mobile buffer 110 is contactlessly driven by a linear motor or the like. In FIG. 1, a track 120 of the mobile buffer 110 is shown for reference. Here, since the sidewall 100sw shown in FIG. 1 is linear in a top view, the horizontal orientation D1 and the track 120 are linear, but in some examples in which the sidewall 100sw is curved in the top view, the horizontal orientation D1 and the track 120 may also be curved along the sidewall 100sw.

In addition, the mobile buffer 110 moves between the sidewall 100sw and the robot 10 (each of the first robot position and the second robot position) in the top view, and passes through a first position (see a position P1 in FIG. 1) suitable for transferring the substrate W to and from the first robot 10-1 and a second position (see a position P2 in FIG. 1) suitable for transferring the substrate W to and from the second robot 10-2. As described above, the mobile buffer 110 moves between the sidewall 100sw and the robot 10, and moves within a range in which the substrate W can be transferred to and from each robot 10. Therefore, the robot 10 that transports the substrate W to and from the processing chamber PC can be configured to cooperate with the mobile buffer 110, and the efficiency of substrate transport can be improved. Although FIG. 1 illustrates the case where the position P1 and the position P2 are located in front of the robot 10, they may be shifted from the front of the robot 10, and may be located at (near) a position close to the robot 10 to such an extent that they can be accessed from the robot 10.

In FIG. 1, the track 120 is described between the sidewall 100sw and the robot 10. But in other examples, the track 120 may be in a position overlapping with the turning region 10rt of the robot 10 in the top view, or may be in a position farther than the robot 10 from the sidewall 100sw. On the other hand, as shown in FIG. 1, the movement locus of the mobile buffer 110 overlaps the turning region 10rt of the robot 10. This may reduce the width of the transport chamber 100.

Here, the "movement locus of the upper unit" refers to a region through which the shape of the mobile buffer 110 passes in the top view (region extending along the moving direction of the mobile buffer 110). The "movement locus of the mobile buffer 110" may be a region through which the substrate W held by the mobile buffer 110 passes (region extending along the moving direction of the mobile buffer 110).

The robot 10 transfers the substrate W between the mobile buffer 110 and the processing chamber PC by cooperating with the movement of the mobile buffer 110. For example, when the robot 10 is instructed to put the substrate W into the processing chamber PC, the mobile buffer 110 holding an unprocessed substrate W moves to the vicinity of the robot 10. The robot 10 acquires the unprocessed substrate W from the mobile buffer 110 and puts the acquired unprocessed substrate W into the processing chamber PC.

When the robot 10 is instructed to take out the substrate W from the processing chamber PC, an empty (not holding the substrate W) mobile buffer 110 moves to the vicinity of the robot 10. The robot 10 takes out the processed substrate W from the processing chamber PC, and delivers the processed substrate W to the mobile buffer 110.

As shown in FIG. 1, if each of the plurality of robots 10 is disposed in front of the processing chamber PC, the mobile buffer 110 can also be stopped in front of the processing chamber PC (refer to the mobile buffer 110 indicated by a broken line in FIG. 1). In this way, the moving distance of the substrate W in the loading and unloading of the substrate W by the robot 10 with respect to the processing chamber PC may be minimized. Also, the transport efficiency may be increased. In addition, since the number and/or complexity of operations of the robot 10 can be reduced, the cost and/or complexity of the robot 10 can also be reduced.

In this way, by using the movable mobile buffer 110 as the buffer, the weight of the object or workpiece to be moved may be reduced, as compared with the case where the robot 10 is a movable type, and the moving mechanism may be simplified. As a result, since the operation rate of the moving mechanism is improved, the availability of the transport of the substrate W may be increased, and the transport efficiency of the substrate W may be improved.

Because the processing time for the substrate W in each processing chamber PC tends to be long due to the multi-layering of semiconductors formed in the substrate W, the number of the processing chambers PC per one transport chamber 100 may be increased to improve the number of the substrates W processed per unit time.

Improving the transport efficiency of the substrate W in the transport chamber 100, such as the transport system 1, may be suitable for the configuration in which the number of the processing chamber PC is increased. In addition, since the robot 10 is fixed, the height of the transport chamber 100 can be reduced and the volume of the transport chamber 100 can be reduced. Thus, the operation cost of the transport chamber 100 can be reduced.

Although FIG. 1 shows a part of the transport chamber 100, an example arrangement of the processing chamber PC, the robot 10, the mobile buffer 110, and the like in the entire transport chamber 100 will be described later with reference to FIG. 3A. Configuration examples of the robot 10 and the mobile buffer 110 will be described later with reference to FIG. 4.

Although the robot 10 shown in FIG. 1 can also access a load lock chamber corresponding to the entrance and exit of the substrate W in the transport chamber 100, there are various variations in the shape of the top surface of the transport chamber 100 and the arrangement of the load lock chamber and the processing chamber PC.

Therefore, an example arrangement of the load lock chamber will be described below with reference to FIGS. 2A and 2B. In the case of a load lock chamber with a built-in robot, the robot 10 shown in FIG. 1 may not be configured to access the load lock chamber as long as the built-in robot can transfer the substrate W with the mobile buffer 110. As shown in FIG. 1, an apparatus including the robot 10 and the mobile buffer 110 may be referred to as a transport device 5. The robot 10 may be a single-arm robot described later with reference to FIGS. 6A and 6B or a double-arm robot described later with reference to FIGS. 6C and 6D.

Figure 2A:
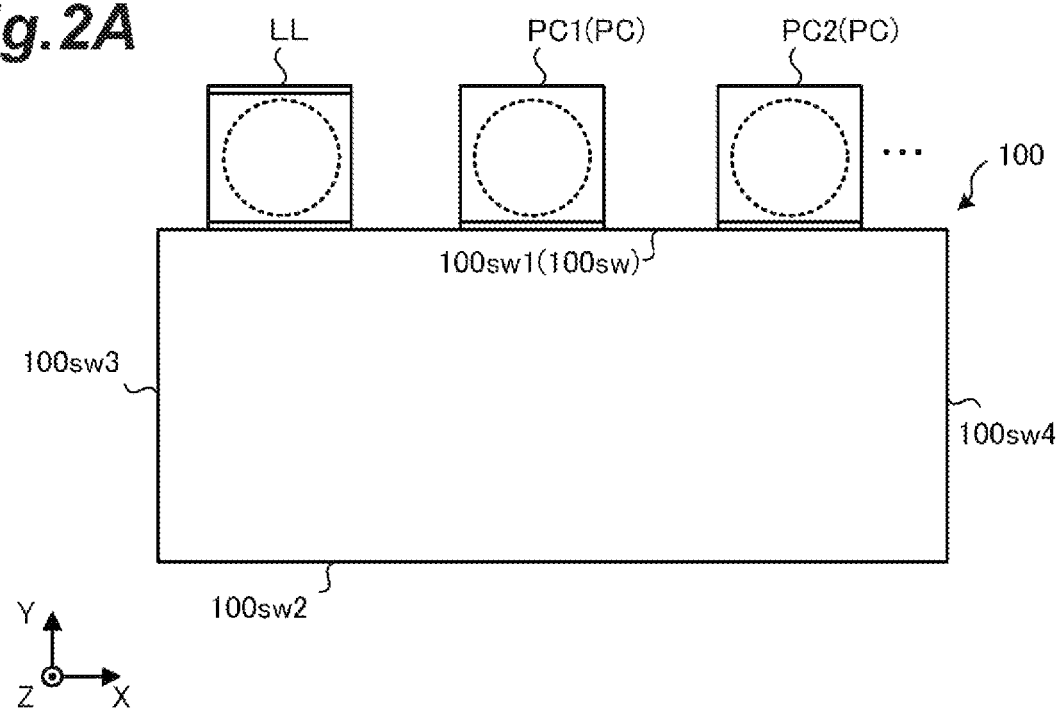
FIG. 2A is a top view schematically illustrating a first arrangement example of a load lock chamber.
Figure 2B:
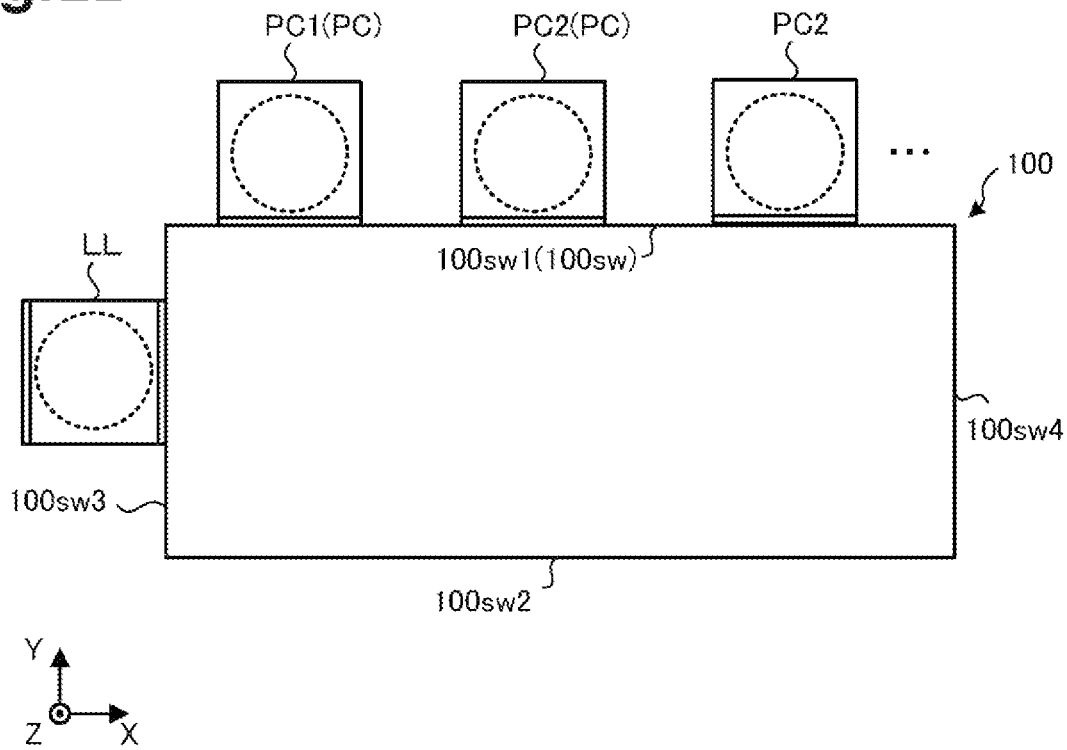
FIG. 2B is a top view schematically illustrating a second arrangement example of the load lock chamber.

FIG. 2A and FIG. 2B are top views schematically showing the arrangement examples 1 and 2 of the load lock chamber LL. In FIGS. 2A and 2B, the robot 10 and the mobile buffer 110 shown in FIG. 1 are omitted for purposes of illustration. FIGS. 2A and 2B show a case where the transport chamber 100 has a rectangular shape in the top view and the processing chamber PC is provided on a long side of the rectangle. As described above, by arranging the processing chamber PC on the long side of the rectangular transport chamber 100, the transport chamber 100 can be flexibly expanded even when the number of the processing chamber PC increases.

In FIGS. 2A and 2B, the sidewall 100*sw* (see FIG. 1) corresponding to the long side of the rectangle is described as a first sidewall 100*sw*1 and a second sidewall 100*sw*2, and the sidewall 100*sw* corresponding to a short side is described as a third sidewall 100*sw*3 and a fourth sidewall 100*sw*4. Although one load lock chamber LL and one or two second processing chambers PC2 are shown in FIGS. 2A and 2B, two or more load lock chambers LL or three or more second processing chambers PC2 may be provided. As already described with reference to FIG. 1, the processing chamber PC closest to the load lock chamber LL is referred to as the first processing chamber PC1, and the processing chamber PC other than the first processing chamber PC1 are referred to as the second processing chamber PC2.

FIG. 2A shows a case where the load lock chamber LL is provided in the sidewall 100*sw* in which the plurality of processing chambers PC is provided. Although FIG. 2A shows the case where the plurality of processing chambers PC are provided in the first sidewall 100*sw*1, the plurality of processing chambers PC may be provided in the second sidewall 100*sw*2. Here, the load lock chamber LL changes the internal pressure between a reduced-pressure atmosphere and an atmospheric-pressure atmosphere. For example, when the substrate W (see FIG. 1) is carried into the transport chamber 100 from the outside, the internal pressure of the load lock chamber LL is adjusted to the atmospheric atmosphere, and the first port, which is the outward opening of the load lock chamber LL, is opened. After closing the first port, the internal pressure of the load lock chamber LL is adjusted to a reduced-pressure atmosphere, and the second port, which is an opening on the transport chamber 100 side, is opened.

FIG. 2B shows a case where the load lock chamber LL is provided in the third sidewall 100*sw*3 (short side) adjacent to the first sidewall 100*sw*1 (long side) in which the plurality of processing chambers PC is provided. In other examples, the load lock chamber LL may be provided in the fourth sidewall 100*sw*4. Thus, the load lock chamber LL may be located in the sidewall 100*sw* different from the sidewall 100*sw* in which the processing chamber PC is located. Although FIG. 2B shows the case where the load lock chamber LL is provided in the third sidewall 100*sw*3, it may be provided in the fourth sidewall 100*sw*4.

Although FIGS. 2A and 2B show the cases where the transport chamber 100 has a rectangular shape in the top view, the transport system 1 shown in FIG. 1 can be applied to a case where the transport chamber 100 has another shape such as a polygonal shape or a circular shape. Hereinafter, the configuration of the transport system 1 will be described in more detail.

Figure 3A:
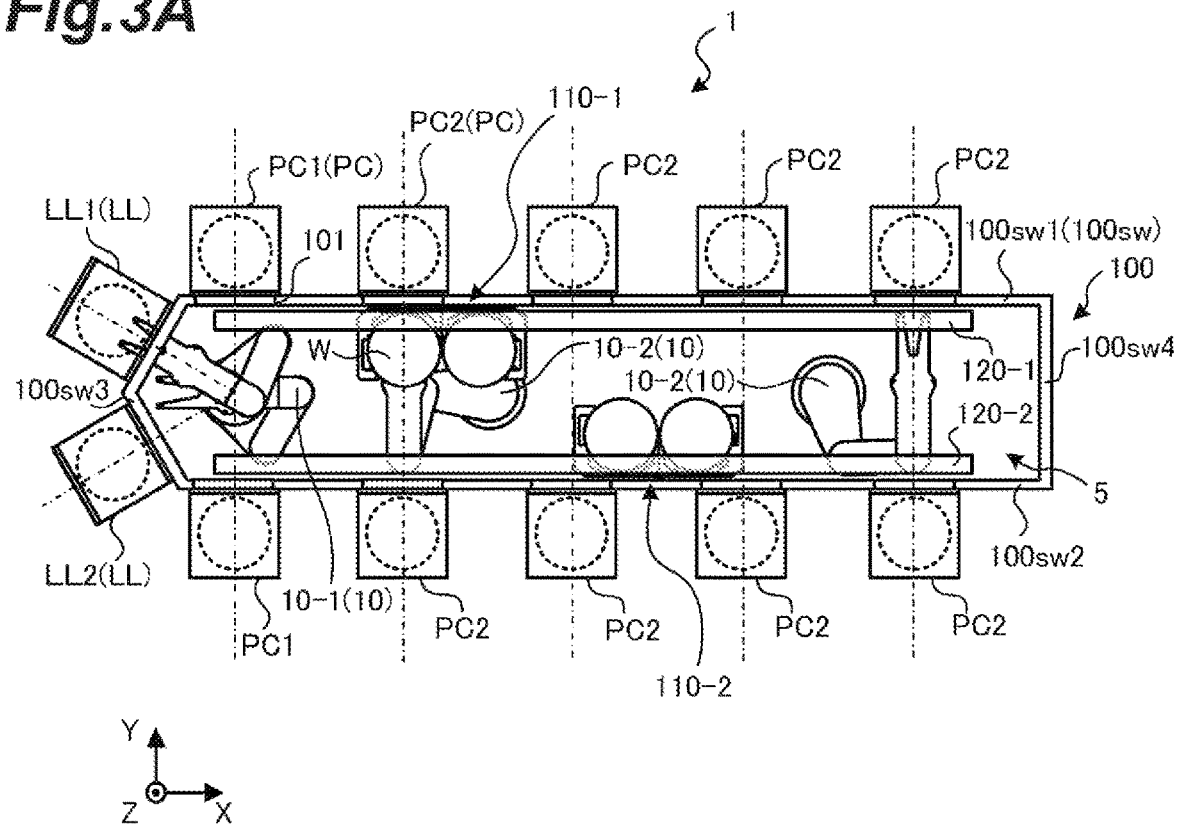
FIG. 3A is a top view of the transport system of FIG. 1.

FIG. 3A is a top view of the transport system 1. As illustrated in FIG. 3A, five processing chambers PC are provided at each of the first sidewall 100*sw*1 and the second sidewall 100*sw*2 that are parallel to each other, so that the five processing chambers PC and the five processing chambers PC face each other. The third sidewall 100*sw*3 connecting the first sidewall 100*sw*1 and the second sidewall 100*sw*2 is provided with two load lock chambers LL (a load lock chamber LL1 and a load lock chamber LL2). Although FIG. 3A shows the case where the third sidewall 100*sw*3 is bent toward the outside of the room, it may be parallel to the fourth sidewall 100*sw*4 without being bent.

In some examples, in the first sidewall 100*sw*1, the processing chamber PC closest to the load lock chamber LL1 may be referred to as the first processing chamber PC1. Additionally, or alternatively, in the second sidewall 100*sw*2, the processing chamber PC closest to the load lock chamber LL2 may also be referred to as the first processing chamber PC1. One or more other processing chambers PC shown in FIG. 3A may be referred to as the second processing chamber PC2.

The plurality of robots 10 is arranged at an intermediate position between the first sidewall 100*sw*1 and the second sidewall 100*sw*2. In the case shown in FIG. 3A, one first robot 10-1 and two second robots 10-2 are arranged.

In some examples, the first robot 10-1 is arranged at an intermediate position of opposing first processing chambers PC1 (the first chamber and an opposite side chamber). The first robot 10-1 then accesses the load lock chamber LL1, the load lock chamber LL2, and two first processing chambers PC1. In some examples, the first robot 10-1 corresponds to a double-arm robot 10C described later with reference to FIGS. 6C and 6D.

Each of the two second robots 10-2 is arranged at an intermediate position of opposing second processing chambers PC2 (the second chamber and an opposite side chamber) and an intermediate position of adjacent second processing chambers PC2 (the second chamber and a third chamber). Then, each of the two second robots 10-2 accesses four second processing chambers PC2. In some examples, the second robot 10-2 corresponds to a multi-degree of freedom robot 10B described later with reference to FIG. 6B.

In addition, when accessing each of the adjacent two second processing chambers PC2, the second robot 10-2 is configured to move its hand (e.g., grasping or transfer mechanism) along the moving direction of the mobile buffer 110 while keeping the hand in a posture facing the second processing chamber PC2. Each of the second robots 10-2 may transfer the substrate W to and from the adjacent two second processing chambers PC2 from the front. In this way, since the plurality of processing chambers PC is accessed without changing the direction of the hand, the operation of the robot 10 can be simplified and the substrate W can be quickly transported.

As shown in FIG. 3A, the first robot 10-1 transfers the substrate W (see FIG. 1) among the mobile buffer 110, the processing chamber PC, and the load lock chamber LL. In this way, the robot 10 in the room of the transport chamber 100 also accesses the load lock chamber LL, so that a built-in robot in the load lock chamber LL may be omitted to downsize the load lock chamber LL.

As shown in FIG. 3A, the transport chamber 100 has a shape symmetrical with respect to a "line of symmetry" parallel to the first sidewall 100sw1 and the second sidewall 100sw2. The mobile buffer 110 shown in FIG. 3A is a "side-by-side buffer" in which two substrates W can be placed side by side in the moving direction (direction along the X-axis). Details of this configuration will be described in further detail later with reference to FIG. 5A. The mobile buffer 110 may be a "multistage buffer", which will be described later with reference to FIG. 8A.

The first sidewall 100sw1 and the second sidewall 100sw2 are linear in the top view, and the five processing chambers PC arranged in a horizontal orientation are provided. The plurality of robots 10 are provided along the arrangement direction of the plurality of processing chambers PC. The mobile buffer 110 moves along a track 120 fixed to a top surface of the transport chamber 100 or the like. The configurations of the mobile buffer 110 and the track 120 will be described in further detail later with reference to FIG. 4. Hereinafter, "-1" may be added to the mobile buffer 110 and the track 120 located close to the first sidewall 100sw1, and "-2" may be added to the mobile buffer 110 and the track 120 located close to the second sidewall 100sw2.

A first mobile buffer 110-1 moves between the first sidewall 100sw1 and the robot 10. In some examples, as described above, a first track 120-1 may not be provided between the first sidewall 100sw1 and the robot 10. That is, if the first mobile buffer 110-1 moves between the first sidewall 100sw1 and the robot 10, the first track 120-1 may be located at a number of different positions.

A second mobile buffer 110-2 moves between the second sidewall 100sw2 and the robot 10 (each of the first robot position and the second robot position). In some examples, as described above, a second track 120-2 may not be provided between the second sidewall 100sw2 and the robot 10. That is, if the second mobile buffer 110-2 moves between the second sidewall 100sw2 and the robot 10, the second track 120-2 may be located at a number of different positions.

As described above, by providing two mobile buffers 110 (the first mobile buffer 110-1 and the second mobile buffer 110-2) moving with the robot 10 interposed therebetween, the robot 10 can use the mobile buffer 110 closer to the processing chamber PC, and the moving distance of the substrate W accompanying the transport of the substrate W can be shortened. Therefore, the transport efficiency of the substrate W can be increased.

As shown in FIG. 3A, each the robots 10 includes a hand on which the substrate W is placed, and an arm that moves the hand by at least a turning operation. Here, the arm of the robot 10 can turn without interfering with the first sidewall 100sw1 and the second sidewall 100sw2. The arm of the robot 10 may have a length set to avoid interfering with the first sidewall 100sw1 and the second sidewall 100sw2. In some examples, the robot 10 can access four processing chambers PC, or two processing chambers PC and the two load lock chambers LL while suppressing the width of the transport chamber 100.

The second robot 10-2 is fixed to a position at which the substrate W can be transferred to and from the adjacent two processing chambers PC in the sidewall 100sw (in FIG. 3A, an intermediate position between adjacent two processing chambers PC2). As shown in FIG. 3A, the second robot 10-2 accesses total four processing chambers PC2 including the two adjacent processing chambers PC2 of the first sidewall 100sw1 and the two adjacent processing chambers PC2 of the second sidewall 100sw2.

In addition, the movement locus of the mobile buffer 110 overlaps the hand of the robot 10 facing a processing chamber PC. As shown in FIG. 3A, in the second robot 10-2, the hand facing the processing chamber PC overlaps both the movement locus of the first mobile buffer 110-1 and the movement locus of the second mobile buffer 110-2. In some examples the robot 10 may be arranged such that the hand oriented toward the processing chamber PC overlaps one of the trajectories of the first mobile buffer 110-1 and the second mobile buffer 110-2. Even in this case, the width of the transport chamber 100 can be made smaller than that in the case where they do not overlap each other.

In some examples, the mobile buffer 110 moves to the lower side of the hand of the robot 10 that has carried the processed substrate W from the processing chamber PC into the room of the transport chamber 100, and receives the substrate W. The robot 10 transports the substrate W to the mobile buffer 110 by lowering the hand which has been raised to a position higher than the substrate W. In this way, interference between the mobile buffer 110 and the robot 10 may be prevented, and the substrate W may be efficiently transferred.

As shown in FIG. 3A, the first sidewall 100sw1 and the second sidewall 100sw2 are provided with opposing processing chambers PC respectively, and each robot 10 transfers the substrate W with the opposing processing chambers PC. In some examples, as described above, the transport chamber 100 has a shape symmetrical with respect to a line parallel to the moving direction of the mobile buffer 110. Further, each robot 10 is fixed so that the turning center is at an intermediate position between the movement locus of the first mobile buffer 110-1 and the movement locus of the second mobile buffer 110-2. In this way, taught information of the robot 10 may be shared or diverted, and the cost for teaching of the robot 10 may be reduced.

Figure 3B:
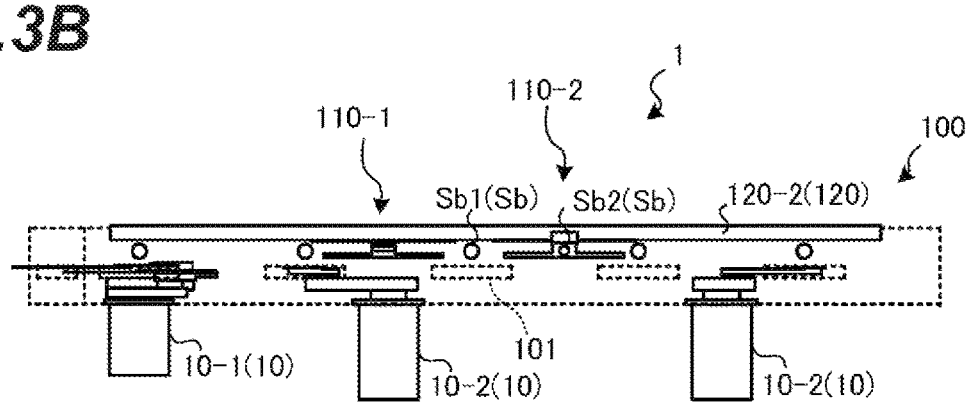
FIG. 3B is a first side view of the transport system.

Next, the side shape of the transport system 1 shown in FIG. 3A will be described with reference to FIG. 3B. FIG. 3B is a first side view of the transport system 1 shown in FIG. 3A as viewed from the second sidewall 100$sw$2 side. In addition, the first track 120-1 is hidden behind the second track 120-2, and thus is not illustrated in FIG. 3B. In FIG. 3B, the outer wall of the transport chamber 100 is indicated by a broken line. In addition, in FIG. 3B, since the same reference numerals are assigned to the configuration element shown in FIG. 3A, redundant description will be omitted or simplified.

As shown in FIG. 3B, the track 120 is provided on the top surface of the transport chamber 100, and the mobile buffer 110 (the first mobile buffer 110-1 and the second mobile buffer 110-2) are provided so as to be suspended from the track 120. Further, buffer detection sensors Sb1 are provided on the sidewall of the transport chamber 100 in a horizontal orientation with a space therebetween. Although five sensors are shown in FIG. 3B, other example may include a greater or fewer number of sensors.

The mobile buffer 110 is provided with a buffer detection sensor Sb2 at a height corresponding to the buffer detection sensor Sb1. A buffer detection sensor Sb (a set of the buffer detection sensor Sb1 and the buffer detection sensor Sb2) is a non-contact type position sensor, and detects a position of the mobile buffer 110 in the transport chamber 100. In FIG. 3B, an opening 101 provided on the sidewall of the transport chamber 100 is indicated by a broken line. The opening 101 is provided at a position lower than the mobile buffer 110, for example. The robot 10 moves the hand facing the opening 101 forward to pass through the opening 101, and accesses the processing chamber PC or the load lock chamber LL.

As shown in FIG. 3B, the mobile buffer 110 moves to a position higher than the robot 10 in the posture in which the hand is lowered. By providing the mobile buffer 110 in this manner, interference with the robot 10 can be avoided. When the robot 10 transfers the substrate W to and from the mobile buffer 110, the hand is raised to access the mobile buffer 110.

Figure 3C:
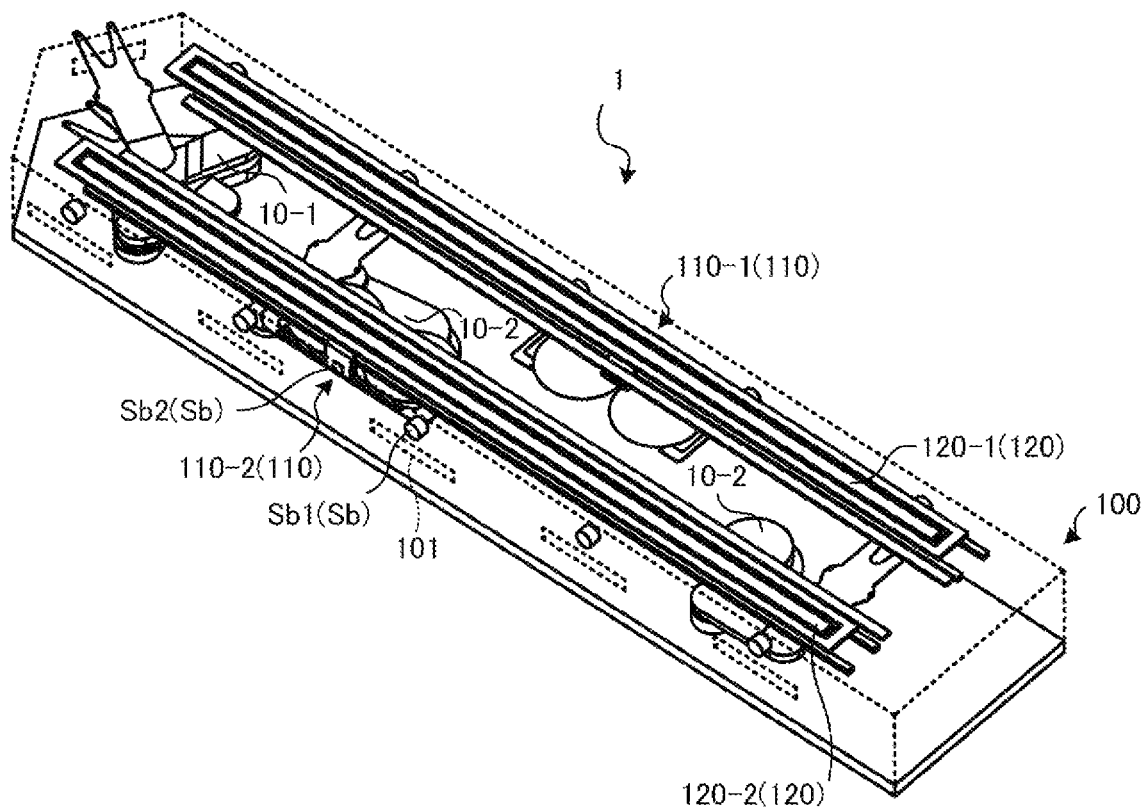
FIG. 3C is a perspective view of the transport system.

Next, the shape of the transport system 1 shown in FIG. 3A as viewed obliquely from above will be described with reference to FIG. 3C. FIG. 3C is a perspective view of the transport system 1. In FIG. 3C, a top wall and the sidewall of the transport chamber 100 are indicated by broken lines. Further, in FIG. 3C, since the same reference numerals are given to the configuration element shown in FIG. 3A and FIG. 3B, redundant description will be omitted or brief description will be given below.

As shown in FIG. 3C, two tracks 120 (the first track 120-1 and the second track 120-2) are fixed to the top wall of the transport chamber 100. The first mobile buffer 110-1 is suspended from the first track 120-1, and the second mobile buffer 110-2 is suspended from the second track 120-2. Each mobile buffer 110 moves along the track 120. Each robot 10 is fixed to the floor wall of the transport chamber 100.

Figure 4:
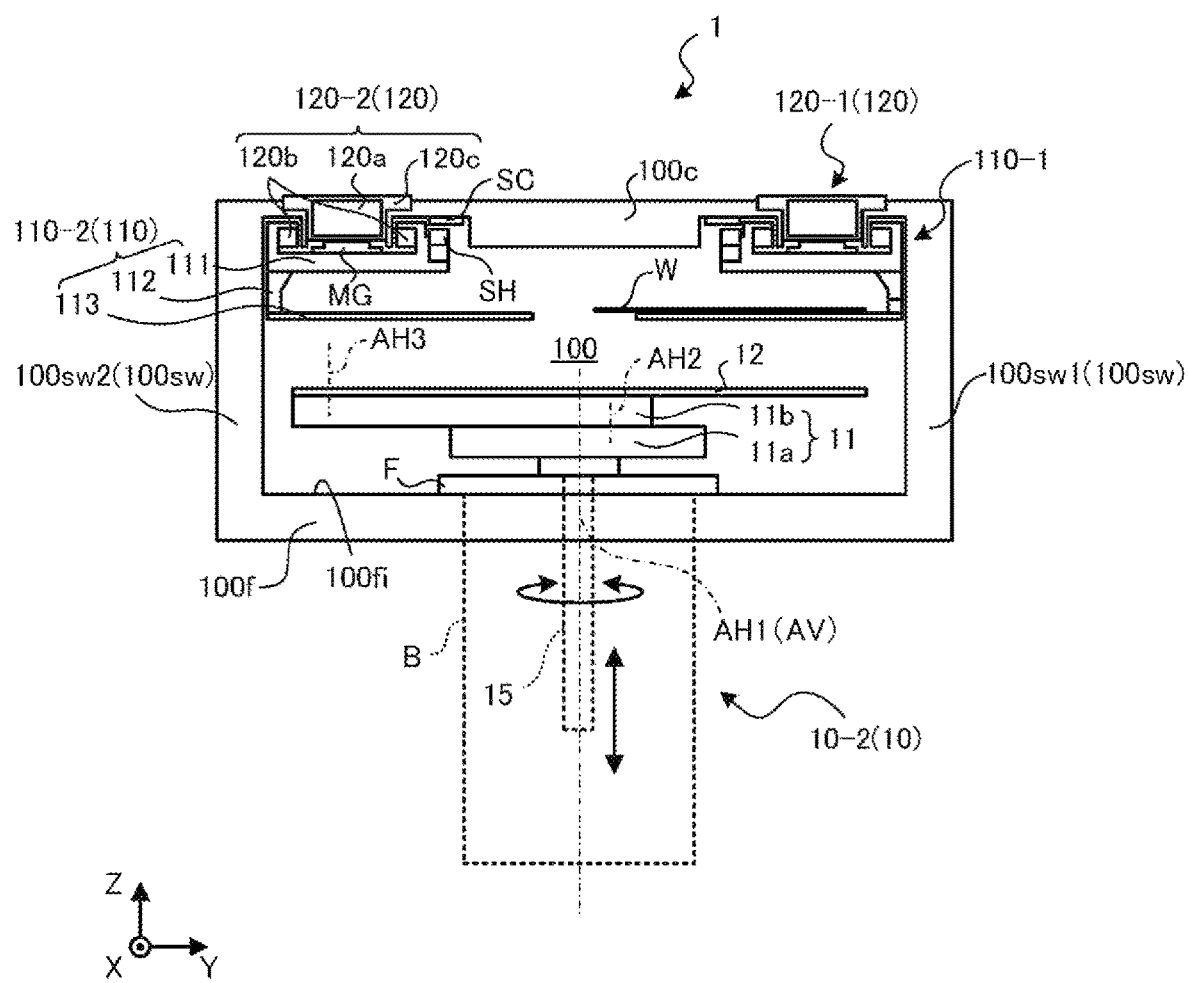
FIG. 4 is a second schematic side view of the transport system of FIG. 1.

Next, a configuration example of the robot 10 and the mobile buffer 110 will be described with reference to FIG. 4. FIG. 4 is a second side view of the transport system 1 shown in FIG. 3A as viewed from the fourth sidewall 100$sw$4 side. In FIG. 4, the second robot 10-2 closest to the fourth sidewall 100$sw$4 is shown as the robot 10.

A configuration example of the second robot 10-2 will be described. As shown in FIG. 4, the second robot 10-2 includes an arm 11, a hand 12, a lifting mechanism 15 (lifter), a flange F, and a base portion B. The arm 11 includes a first arm 11$a$ and a second arm 11$b$.

The base portion B of the second robot 10-2 penetrates the floor wall 100$f$ of the transport chamber 100 and protrudes outside the transport chamber 100. Further, the flange F supports the second robot 10-2 by a floor surface 100$fi$ of the floor wall 100$f$ and maintains the airtightness of the transport chamber 100. In some examples, the volume of the transport chamber 100 can be reduced by projecting the base portion B of the second robot 10-2 from the transport chamber 100. In addition, power may be supplied the second robot 10-2 from the outside of the transport chamber 100, and the second robot 10-2 may be accessed from the outside of the transport chamber 100.

The lifting mechanism 15 supports the base end side of the first arm 11$a$ rotatably around a first rotation shaft AH1, and moves up and down along an elevating shaft AV. The lifting mechanism 15 itself may be rotated around the first rotation shaft AH1. The first arm 11$a$ supports the proximal end of the second arm 11$b$ at the distal end so as to be rotatable around a second rotation shaft AH2. The second arm 11$b$ supports the proximal end of the hand 12 at the distal end so as to be rotatable around a third rotation shaft AH3. For example, as shown in FIGS. 1 and 3A, the hand 12 has a fork portion whose tip side is bifurcated, and supports the substrate W on the upper surface side. The hand 12 may hold a plurality of the substrate W in multiple stages.

In some examples, the first arm 11$a$, the second arm 11$b$, and the hand 12 corresponding to the horizontal arms independently turn around the first rotation shaft AH1, the second rotation shaft AH2, and the third rotation shaft AH3, respectively. Thus, the second robot 10-2 can access the adjacent processing chambers PC in the first sidewall 100$sw$1 or the second sidewall 100$sw$2. In the case where the second robot 10-2 is disposed in front of each processing chamber PC, the second arm 11$b$ and the hand 12 may be configured to turn in accordance with turning of the first arm 11$a$ around the first rotation shaft AH1.

There are three driving sources (actuators) if the first arm 11$a$, the second arm 11$b$, and the hand 12 are configured to turn independently, and there are one or two driving sources if the second arm 11$b$ and the hand 12 are configured to turn in accordance with turning of the first arm 11$a$. In some examples, the second robot 10-2 utilizes one more drive source for raising and lowering the lifting mechanism 15.

As shown in FIG. 4, the first arm 11$a$, the second arm 11$b$, and the hand 12 corresponding to the horizontal arms can turn without interfering with the first sidewall 100$sw$1 and the second sidewall 100$sw$2. In some examples, the length of the hand 12 of the second robot 10-2 is smaller than the "transport chamber width", which indicates the distance between the first sidewall 100$sw$1 and the second sidewall 100$sw$2. Also, as shown in FIG. 4, the hand 12 is longer than half the transport chamber width. As described above, according to the second robot 10-2, the width of the transport chamber 100 can be narrowed to be close to the length of the hand 12. Therefore, the volume of the transport chamber 100 can be reduced.

The first robot 10-1 shown in FIG. 3A is a so-called double-arm robot having a first arm unit and a second arm unit. The first arm unit includes the arm 11 and the hand 12 of the second robot 10-2 shown in FIG. 4. Similarly, the second arm unit includes the arm 11 (second arm) and the hand 12 (first arm). Additional example configurations of the shaft configuration of each robot 10 (the first robot 10-1 and the second robot 10-2) will be described later with reference to FIGS. 6A, 6B, 6C, and 6D.

Next, a configuration example of the mobile buffer 110 will be described. Since two mobile buffers 110 are provided symmetrically with respect to the first rotation shaft AH1 of the robot 10, the second track 120-2 and the second mobile buffer 110-2 provided on the second sidewall 100sw2 side will be described below as an example.

As shown in FIG. 4, the second mobile buffer 110-2 includes a moving unit 111 (mover), a column 112, and a holding portion 113 corresponding to a buffer. The moving unit 111 is driven by a drive unit 120a (actuator) of the track 120 fixed to the transport chamber 100. The column 112 is linked to the moving unit 111. The holding portion 113 is supported by the column 112 and supports the substrate W in a horizontal orientation.

In some examples, the moving unit 111 corresponds to a moving unit of a moving magnet type linear motor. In other examples, the linear motor may be an induction type. A moving magnet type, for example where the moving unit 111 includes a magnet MG that is a permanent magnet, will be described in further detail. In other examples, the moving unit 111 may be formed of a material that moves when an induced current flows.

The second track 120-2 includes the drive unit 120a, a guide 120b, and a can 120c. The drive unit 120a corresponds to a stator in the linear motor. Therefore, the "the drive unit 120a" may be referred to as a "stator 120a". A case where the mobile buffer 110 is moved with respect to the track 120 by the driving force of the linear motor is described herein. The linear motor may be a contact type or a non-contact type such as a magnetic levitation type or an air levitation type. The guide 120b is a support member that guides linear motion or curved motion in a plane such as a horizontal plane. In the case shown in FIG. 4, the two guides 120b are provided so that the drive unit 120a is located between the two guides 120 b, and the two guides 120b guide the second mobile buffer 110-2 to linearly move in the direction along the X-axis. The number of the guide 120b may be one.

In some examples, the moving unit 111 of the second mobile buffer 110-2 is contactlessly driven by the stator 120a included in the second track 120-2. For example, the stator 120a is formed by molding the windings with resins or the like and covering the surfaces of the molds with film-like metals. Such a metallic film may include the can 120c described above, and gas generated from resins and the like is trapped inside. In this manner, the second mobile buffer 110-2 is driven in a non-contact manner by the moving magnet system, thereby contributing to cleanliness of the transport chamber 100. In addition, since power can be supplied to the stator 120a via a top wall 100c of the transport chamber 100, this can also contribute to cleanliness of the transport chamber 100.

As shown in FIG. 4, when the substrate W is held by the first mobile buffer 110-1, the robot 10 receives the substrate W by raising the hand 12. Conversely, if the substrate W is held by the hand 12, the robot 10 passes the substrate W to the mobile buffer 110 by lowering the hand 12.

The position of the moving unit 111 in the top view can be detected by a change in current or voltage of the stator 120a in the track 120, or a combination of a scale SC provided in the top wall 100c in the transport chamber 100 and a scale head SH provided in the moving unit 111. As shown in FIG. 4, the scale SC and the scale head SH are provided to face each other with a space therebetween. That is, the scale SC and the scale head SH are non-contact type position sensors. The scale SC extends in the extending direction of the second track 120-2 (the direction along the X-axis).

Although FIG. 4 shows a case where the mobile buffer 110 is of a ceiling-suspended type, other examples may include a floor-mounted type. When the mobile buffer 110 is a floor-mounted type, the drive unit 120a of the track 120 is fixed to the floor wall 100f of the transport chamber 100. The floor-mounted mobile buffer 110 will be described later with reference to FIG. 9A.

Figure 5A:
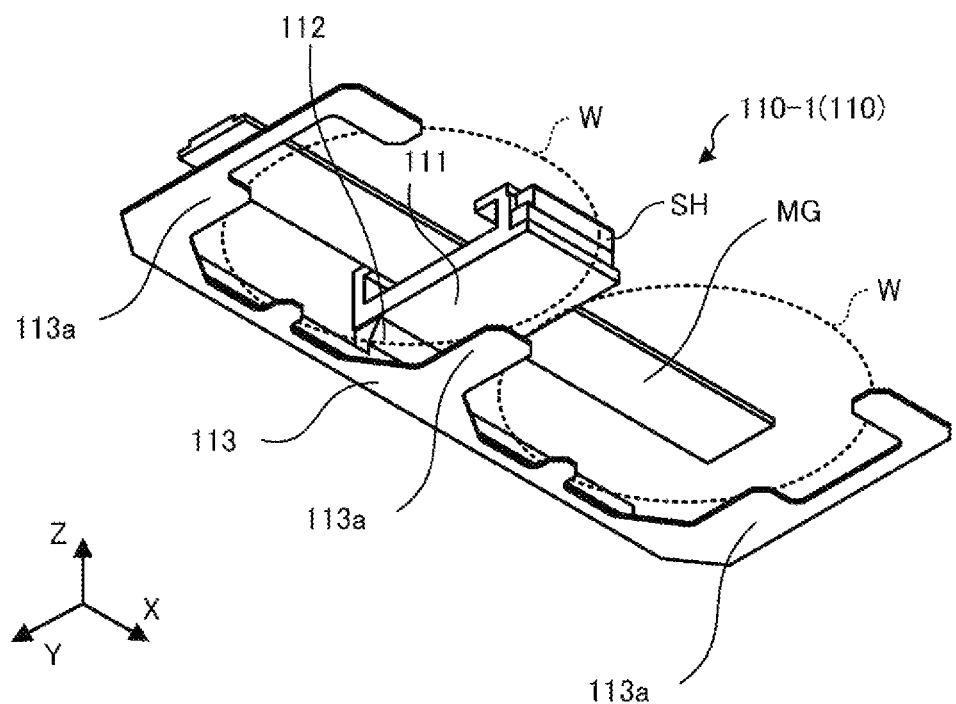
FIG. 5A is a perspective view of an example mobile buffer.
Figure 5B:
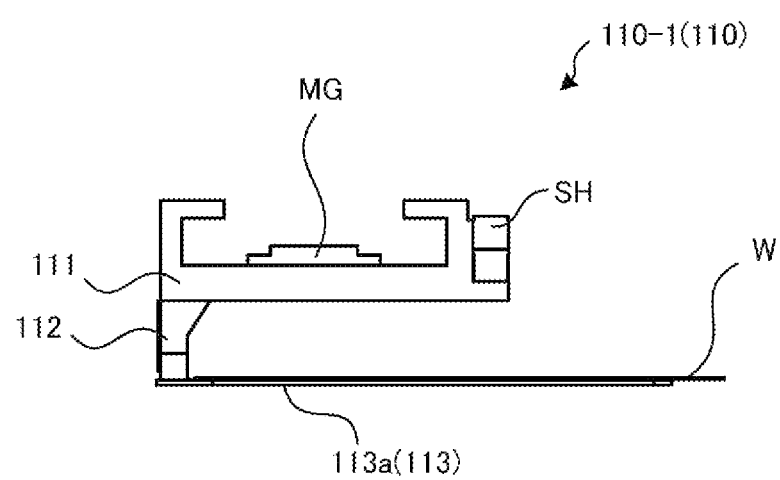
FIG. 5B is a side view of the mobile buffer.

Next, the mobile buffer 110 shown in FIG. 4 will be described in more detail with reference to FIGS. 5A and 5B. FIG. 5A is a perspective view of the mobile buffer 110, and FIG. 5B is a side view of the mobile buffer 110. FIG. 5A corresponds to a perspective view of the first mobile buffer 110-1 as seen obliquely from below, and FIG. 5B corresponds to a side view of the first mobile buffer 110-1 as seen from the negative X-axis direction side.

As shown in FIG. 5A, the moving unit 111 has the magnet MG on the top surface side. Here, the magnet MG extends in the moving direction of the mobile buffer 110 (direction along the X-axis). The column 112 is positioned between the first sidewall 100sw1 and the movement locus of the mobile buffer 110). For example, the column 112 is connected to a position closer to the first sidewall 100sw1 (see FIG. 4) in the moving unit 111, and is located outside the turning region 10rt of the robot 10 (see FIG. 1). The holding portion 113 is supported by the column 112 and extends away from the sidewall 100sw1 to form a top surface for supporting the substrate W. For example, the holding portion 113 is supported by the column 112 at the proximal end side in a posture in which the distal end side is directed away from the first sidewall 100sw1.

As shown in FIG. 5A, the first mobile buffer 110-1 is a side-by-side buffer capable of holding 2 the substrate W arranged in a horizontal orientation along the moving direction. In this way, by using the mobile buffer 110 as a side-by-side buffer, the height of the transport chamber 100 can be kept low. In addition, when the mobile buffer 110 is a side-by-side buffer, one of the two substrate placement positions can be moved to the front of the robot 10 or the like. Therefore, the substrate W can be quickly transferred to and from the robot 10. That is, the horizontal operation of the mobile buffer 110 and the operation of the robot 10 are made to cooperate with each other, so that the efficiency of substrate transportation can be improved.

In some examples, the holding portion 113 has three supports 113a protruding in a horizontal orientation to support the edges of the substrate W, respectively, and a center support 113a of the three supports 113a is shorter than both end supports 113a (two end supports) of the three supports 113a. In this way, by shortening the center support 113a, the robot 10 (see FIG. 4) can transfer the substrate W from an oblique direction in the top view.

For example, even if the hand 12 (see FIG. 4) is brought directly close to the substrate W on the left side (the negative X-axis direction side) shown in FIG. 5A from the positive X-axis direction side, it does not interfere with the support 113a in the middle. For the substrate W on the right side (X-axis positive direction side) shown in FIG. 5A, the hand 12 may be accessed from the X-axis negative direction side.

As shown in FIG. 5B, the moving unit 111 has a concave portion whose top surface is recessed so as to cover the track 120 shown in FIG. 4 from below, and the magnet MG is provided in the concave portion. The scale head SH is provided on a side surface outside the recess. The column 112 has an upper end supported by the moving unit 111 and extends vertically downward, and a lower end supporting the holding portion 113.

Here, in the case of the first mobile buffer 110-1 shown in FIG. 5B, the back surface side (Y-axis positive direction side) is the first sidewall 100sw1 (see FIG. 4). That is, the column 112 extends in the vertical direction (direction along the Z-axis) along the first sidewall 100sw1. The holding portion 113 supported by the column 112 protrudes toward a direction away from the first sidewall 100sw1, and supports the substrate W on the top surface side.

Next, a configuration example of the robot 10 will be described with reference to FIGS. 6A to 6D. FIG. 6A, FIG. 6B, FIG. 6C, and FIG. 6D are top views schematically showing examples 1, 2, 3, and 4 of the robot 10.

Figure 6A:
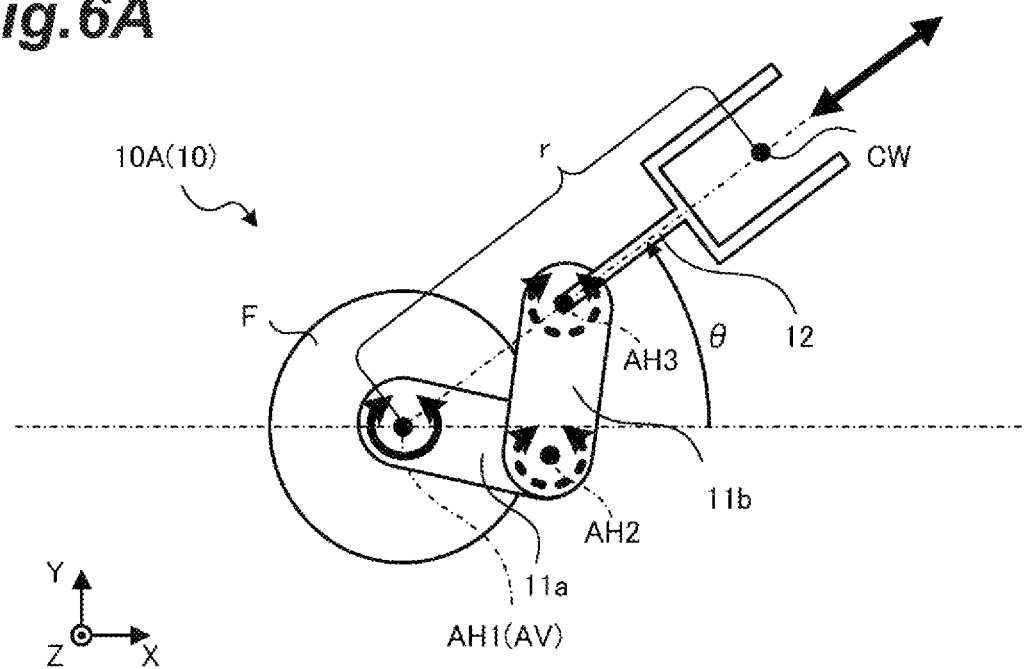
FIG. 6A is a top view schematically illustrating a first example configuration of a robot.

The robot 10 shown in FIG. 6A is an RθZ robot 10A that is a robot having 3 degrees of freedom, 1 degrees of freedom in the vertical orientation and 2 degrees of freedom in the horizontal orientation. Although the elevating shaft AV and the first rotation shaft AH1 are shown as being coaxial in FIG. 6A, they may not be coaxial. The first arm 11a, the second arm 11b, and the hand 12, which are horizontal arms, cooperatively operate so that a substrate center CW moves in the radial direction of the first rotation shaft AH1 while maintaining the posture of the hand 12. The first rotation shaft AH1 corresponds to the turning center of the RθZ robot 10A.

In some examples, the second arm 11b and the hand 12 are rotated around the second rotation shaft AH2 and the third rotation shaft AH3, respectively, by the driving force for rotating the first arm 11a around the first rotation shaft AH1 and the transmission mechanism. Examples of the transmission mechanism include a belt, a gear, and a link mechanism. Further, "the substrate center CW" refers to the center position of the substrate W when the hand 12 holds the substrate W in the normal position.

Thus, the RθZ robot 10A changes a distance r from the first rotation shaft AH1 to the substrate center CW while keeping an angle θ of the straight line passing through the first rotation shaft AH1, the third rotation shaft AH3, and the substrate center CW constant. Here, the angle θ can be an arbitrary angle. Thus, the RθZ robot 10A is a three degree-of-freedom robot 10 with one degree of freedom in the vertical orientation and two degrees of freedom in the horizontal orientation. Hereinafter, the RθZ robot 10A may be referred to as "RθZ robot".

By using the RθZ robot 10A, which is an RθZ robot, as the robot 10, the cost of the robot 10 can be reduced as compared with the case where the robot 10 has four or more degrees of freedom. When the RθZ robot 10A is used as the robot 10, the RθZ robot 10A is disposed in front of the processing chamber PC or the load lock chamber LL. For example, by arranging the robot 10 in front of the processing chamber PC or the load lock chamber LL, the robot 10 can be an Rθz robot having three degrees of freedom.

Figure 6B:
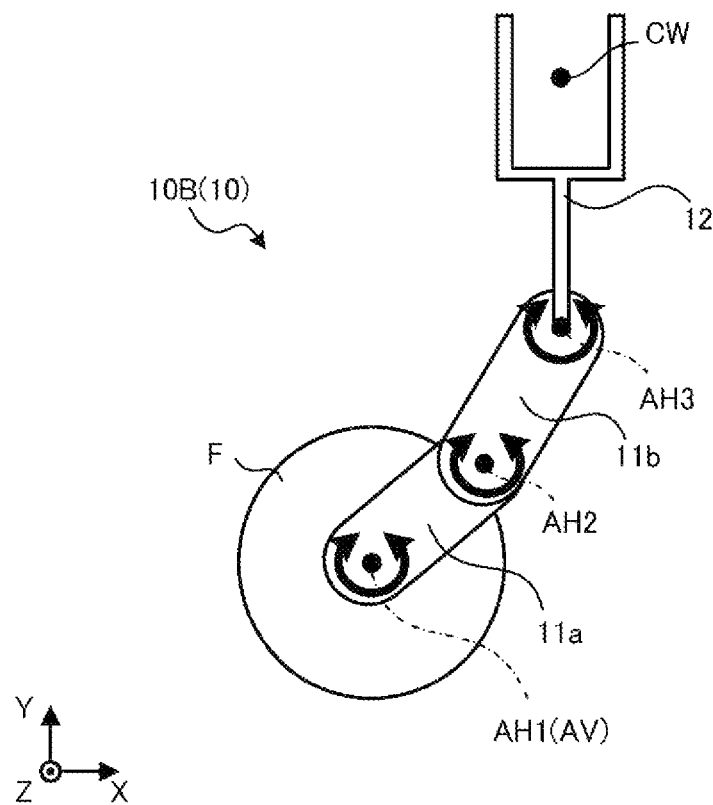
FIG. 6B is a top view schematically illustrating a second example configuration of the robot.

The robot 10 shown in FIG. 6B is the multi-degree of freedom robot 10B which is a robot having four or more degrees of freedom including one degree of freedom in a vertical orientation and three or more degrees of freedom in a horizontal orientation. Although the elevating shaft AV and the first rotation shaft AH1 are shown as being coaxial in FIG. 6B, they may not be coaxial. Unlike the RθZ robot 10A shown in FIG. 6A, the first arm 11a, the second arm 11b, and the hand 12, which are horizontal arms, independently turn around the first rotation shaft AH1, the second rotation shaft AH2, and the third rotation shaft AH3, respectively. The first rotation shaft AH1 corresponds to the turning center of the multi-degree of freedom robot 10B.

As described above, since the multi-degree of freedom robot 10B has at least one redundant axis in the horizontal orientation, the substrate center CW can be moved along an arbitrary path. Therefore, when the multi-degree of freedom robot 10B is used as the robot 10, the multi-degree of freedom robot 10B may not be disposed in front of the processing chamber PC or the load lock chamber LL. For example, even if the robot 10 is not disposed in front of the processing chamber PC or the load lock chamber LL, the substrate W can be transferred to and from the processing chamber PC or the load lock chamber LL.

Figure 6C:
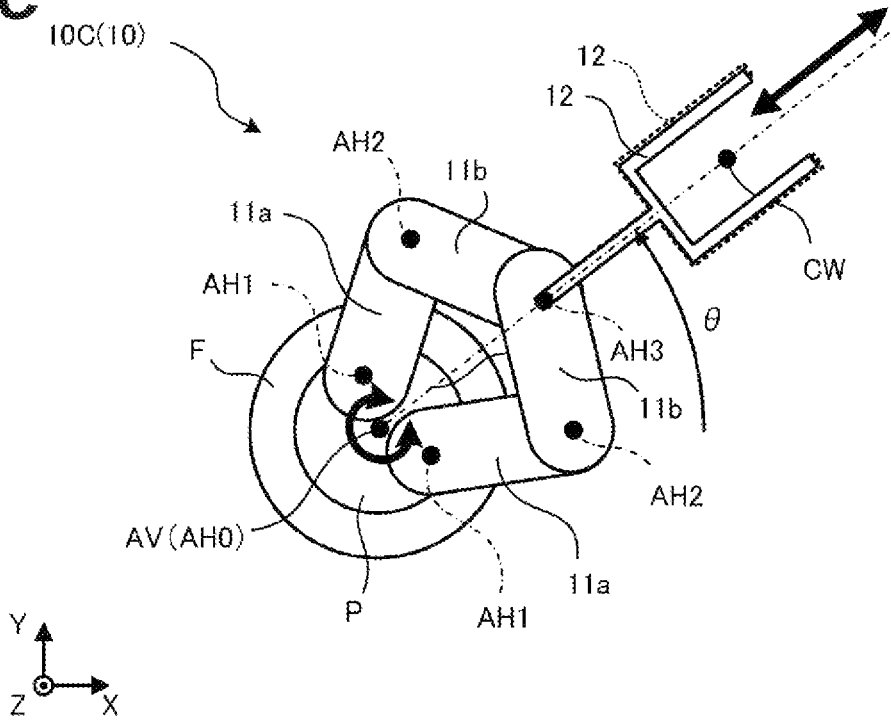
FIG. 6C is a top view schematically illustrating a third example configuration of the robot.

The robot 10 shown in FIG. 6C is the double-arm robot 10C having two horizontal arms of the RθZ robot 10A shown in FIG. 6A. For example, the double-arm robot 10C has two arms (the first arm unit and the second arm unit) each of which has two degrees of freedom in the horizontal orientation, and the double-arm robot 10C further has one degree of freedom in the vertical orientation.

The base end sides of the two first arms 11a are supported by a pedestal P, and the pedestal P moves up and down along the elevating shaft AV and rotates around a rotation shaft AH0. Although FIG. 6C shows the case where the horizontal arms of the RθZ robot 10A shown in FIG. 6A are double-armed, the horizontal arms of the multi-degree of freedom robot 10B shown in FIG. 6B may be double-armed.

Although FIG. 6A shows the case where the hand 12 of the respective arms in the two arms overlap each other when viewed in the direction along the Z-axis, they may not overlap each other. Each arm changes the distance r from the rotation shaft AH0 to the substrate center CW while keeping constant the angle θ of the straight line passing through the rotation shaft AH0, the third rotation shaft AH3 and the substrate center CW. Note that the vertical relationship of the arms in the two arms shown in FIG. 6C may be reversed. The rotation shaft AH0 corresponds to the turning center of the double-arm robot 10C.

Figure 6D:
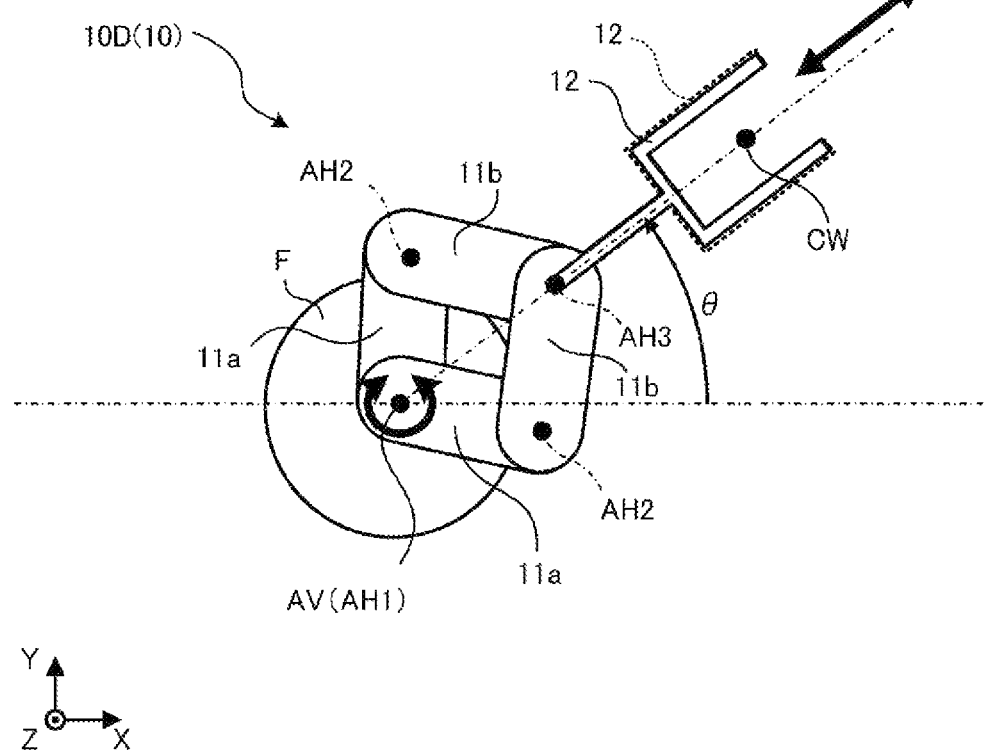
FIG. 6D is a top view schematically illustrating a fourth example configuration of the robot.

A double-arm robot 10D shown in FIG. 6D is another example of the double-arm robot. The double-arm robot 10D shown in FIG. 6D is different from the double-arm robot 10C shown in FIG. 6C in that the elevating shaft AV and the two first rotation shafts AH1 in the two arms are coaxial and the pedestal P is omitted. The rotation shaft AH1 corresponds to the turning center of the double-arm robot 10D.

In some examples, each of the two arms changes the distance r from the rotation shaft AH0 to the substrate center CW while keeping the angle θ of the straight line passing through the first rotation shaft AH1, the third rotation shaft AH3, and the substrate center CW constant. In this way, by making the two first rotation shafts AH1 coaxial and omitting the pedestal P, the double-arm robot 10D can be made compact, and the volume of the transport chamber 100 can be reduced. Note that the vertical relationship of the arms in the two arms shown in FIG. 6D may be reversed.

Figure 7:
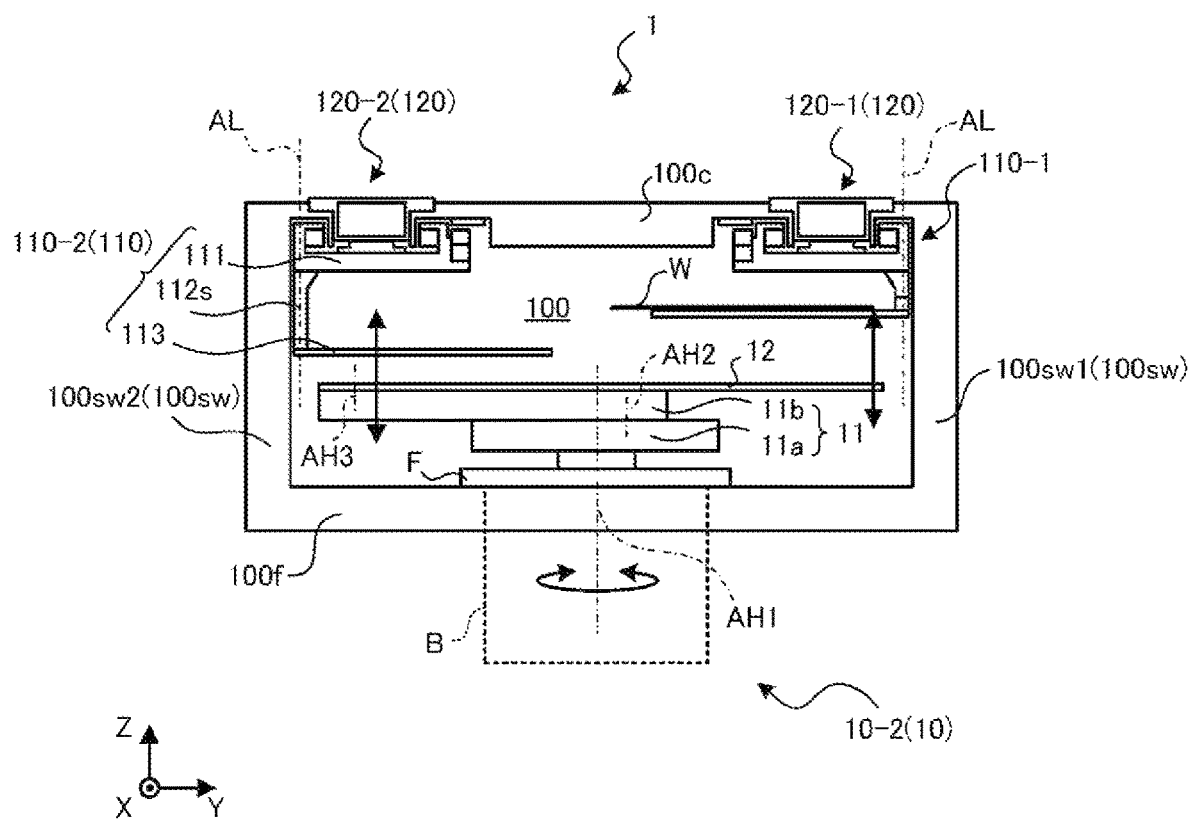
FIG. 7 is a schematic side view of a robot and another example mobile buffer.

Next, examples in which a lifting mechanism is provided in the mobile buffer 110 shown in FIG. 4 and the lifting mechanism is omitted from the robot 10 will be described with reference to FIG. 7. FIG. 7 is a side view schematically illustrating an example of the robot 10 and the mobile buffer 110. The robot 10 and the mobile buffer 110 shown in FIG. 7 are the robot 10 in which the robot 10 does not have a lifting mechanism, and are a mobile buffer 110A in which the mobile buffer 110 has a lifting mechanism instead. Therefore, hereinafter, points different from FIG. 4 will be mainly described.

As shown in FIG. 7, the elevating shaft AV and the lifting mechanism 15 are omitted from the robot 10 shown in FIG. 4. By omitting the elevating shaft AV and the lifting mechanism 15, the height of the base portion B is suppressed to be lower than that of the robot 10 shown in FIG. 4. On the other hand, the mobile buffer 110 includes a lifting column 112s (lifter) that moves up and down along the vertical a lifting shaft AL.

As described above, by omitting the lifting mechanism from the robot 10, the height of the transport chamber 100 can be reduced. In addition, the availability of the robot 10 can be increased by simplifying the configuration of the robot 10.

A drive source (actuator) for driving the lifting column 112s is supplied with direct current by non-contact power supply via the track 120. In this manner, when the non-contact power supply is performed to the mobile buffer 110, in addition to the driving source, a sensor such as a weight sensor or an optical sensor, and a device such as a wireless communication camera can be mounted on the mobile buffer 110.

Therefore, the presence or absence, shape, weight, position, and the like of the substrate W can be detected when the substrate W is placed on the mobile buffer 110. Typically the DC power supply is lower in cost than the AC power supply, which contributes to cost reduction.

As shown in FIG. 7, when the substrate W is held by the first mobile buffer 110-1, the first mobile buffer 110-1 extends the column 112 and lowers the holding portion 113, thereby transporting the substrate W to the hand 12 of the robot 10. Conversely, when the substrate W is held by the hand 12 of the robot 10, the holding portion 113 is raised from below the substrate W to pick up the substrate W.

Further, as shown in FIGS. 7 and 4, one of the robot 10 and the mobile buffer 110 has a lifting mechanism, and the hand 12 of the robot 10 and the mobile buffer 110 do not interfere with each other in the lifting operation in the position where the substrate W is transferred. Therefore, interference avoidance may be achieved without the robot 10 or the mobile buffer 110 performing the interference avoidance operation in the horizontal orientation, and the transport efficiency of the substrate W may be increased.

Figure 8A:
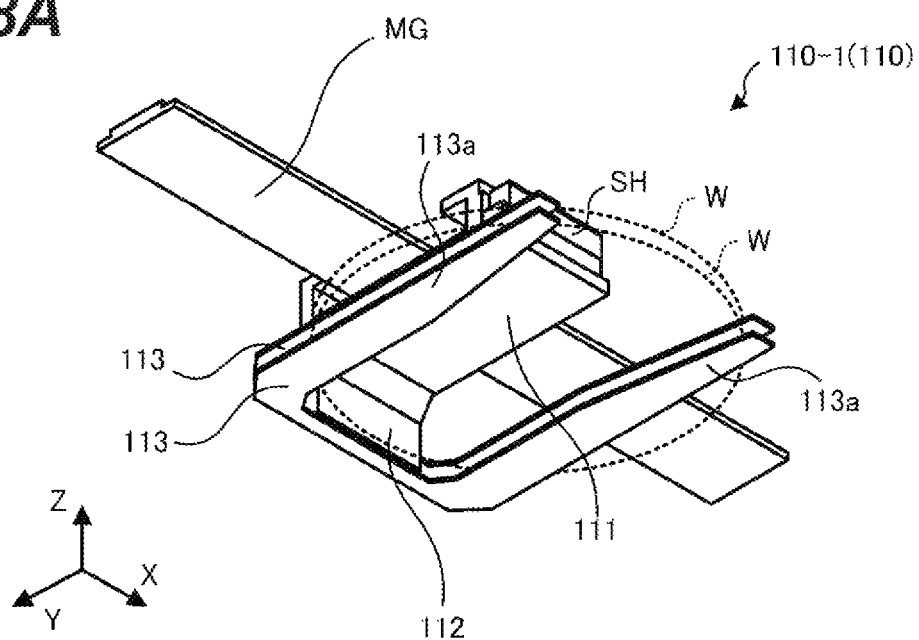
FIG. 8A is a perspective view illustrating an example multistage mobile buffer.

In some examples, the mobile buffer 110 is a side-by-side buffer, as has been described. However, in other examples, the mobile buffer 110 may be a multistage buffer. Therefore, a case where the mobile buffer 110 is a multi-stage buffer will be described below with reference to FIGS. 8A and 8B. FIG. 8A is a perspective view showing a multistage mobile buffer 110, and FIG. 8B is a side view showing the multistage mobile buffer 110.

Figure 8B:
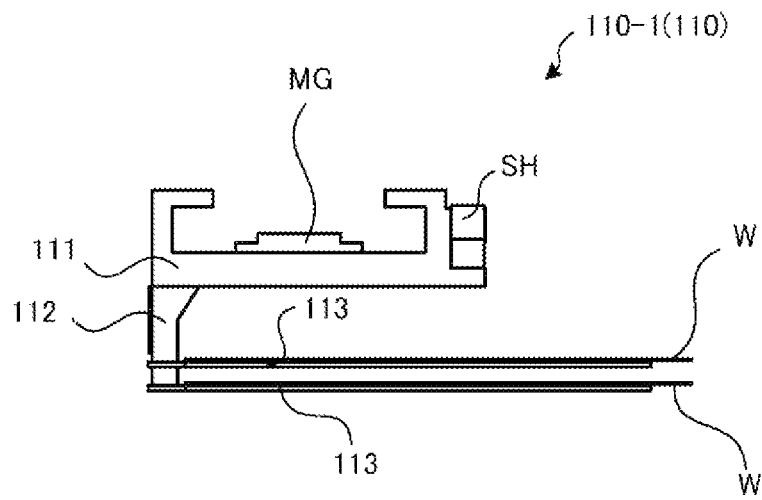
FIG. 8B is a side view illustrating the multistage mobile buffer.

Viewing directions of FIGS. 8A and 8B are the same as the viewing directions of FIGS. 5A and 5B. In FIG. 8A and FIG. 8B, the same reference numerals are assigned to the configuration elements shown in FIG. 5A and FIG. 5B, and therefore, in the following description, redundant description will be omitted or brief description will be given.

As shown in FIG. 8A, the first mobile buffer 110-1 is a multistage buffer capable of holding two substrates W in two stages. Although two stages of multistage buffer is shown in FIGS. 8A and 8B, the number of stages may be three or more. In this way, according to the multi-stage mobile buffer 110, the mobile buffer 110 may be compact in the top view, and the transport chamber 100 may be compact.

In some examples, the holding portion 113 has two supports 113a projecting in a horizontal orientation and supporting edges of the substrate W respectively. An interval between the two supports 113a is large enough to prevent interference even when the hand 12 of the robot 10 (see FIG. 4) moves up and down. In this way, by providing a space between the two supports 113a, the robot 10 can transfer the substrate W by raising and lowering the hand 12 in a posture facing the mobile buffer 110.

In the case of the first mobile buffer 110-1 shown in FIGS. 8A and 8B, the back surface side (Y-axis positive direction side) is the first sidewall 100sw1 (see FIG. 4). That is, the column 112 extends in the vertical direction (direction along the Z-axis) along the first sidewall 100sw1. The holding portions 113 supported by the column 112 are arranged in the vertical direction (direction along the Z-axis). Each of the holding portions 113 protrudes toward a direction away from the first sidewall 100sw1, and supports the substrate W on the top surface side.

Figure 9A:
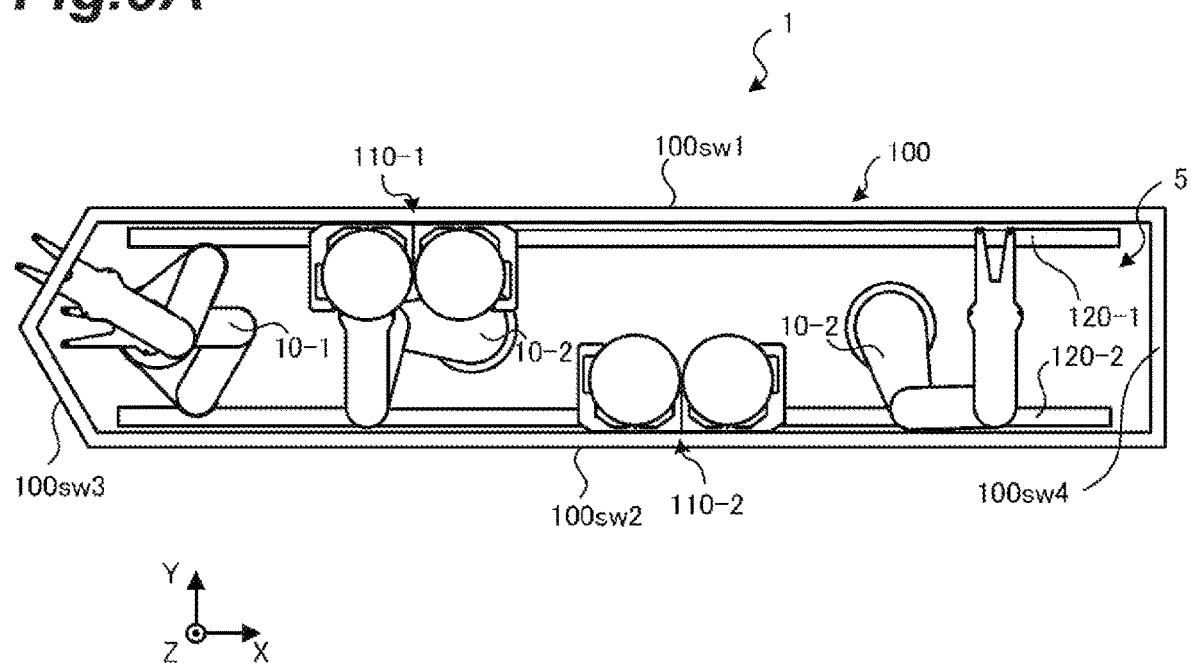
FIG. 9A is a top view of another example transport system.
Figure 9B:
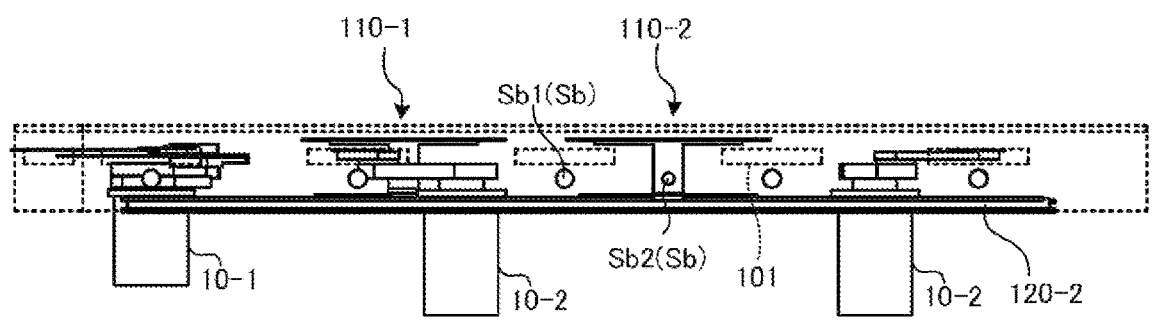
FIG. 9B is a side view of the transport system of FIG. 9A.
Figure 9C:
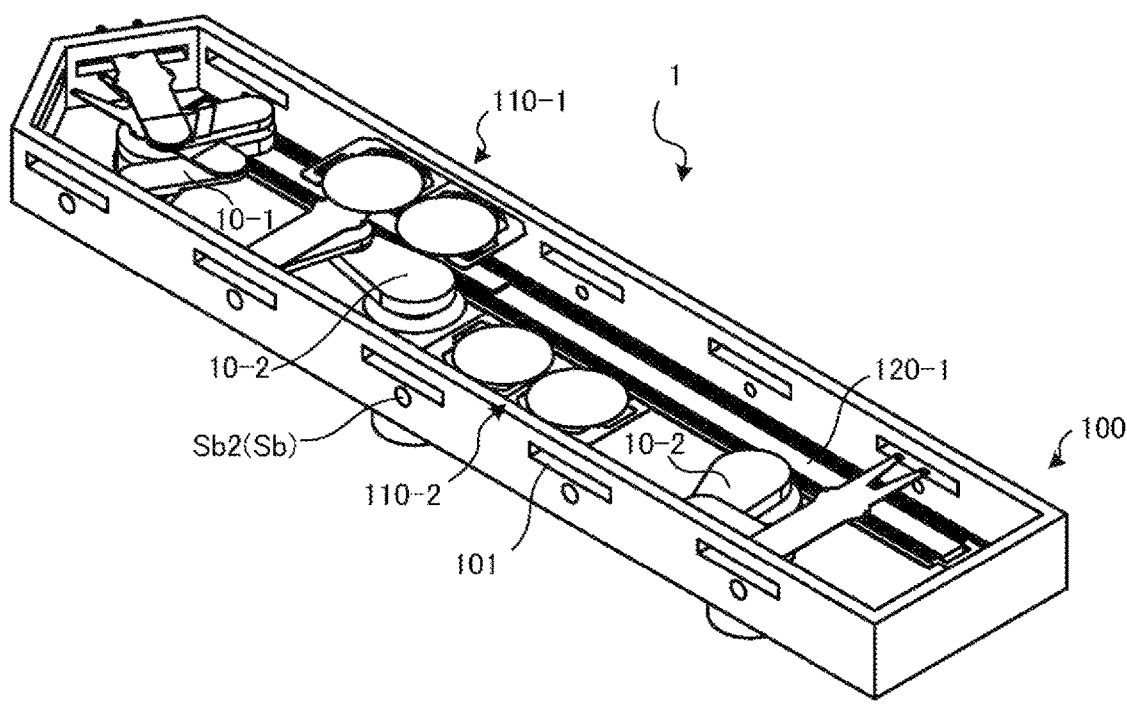
FIG. 9C is a perspective view of the transport system of FIG. 9A.

Although examples where the mobile buffer 110 is of the ceiling-suspended type have been described, the mobile buffer 110 may be of the floor-mounted type. Therefore, hereinafter, a case where the mobile buffer 110 is a floor-mounted type will be described with reference to FIGS. 9A to 11. FIGS. 9A to 9C correspond to FIGS. 3A to 3C, FIG. 10 corresponds to FIG. 4, and FIG. 11 corresponds to FIG. 5A, respectively. In addition, in the following description, the same reference numerals are given to the configuration elements illustrated in FIGS. 3A to 5A, and redundant description of the already described matters will be omitted or simplified.

FIG. 9A is a top view schematically illustrating a transport system 1 according to a modification. Although FIG. 9A corresponds to FIG. 3A, the processing chamber PC and each the load lock chamber LL are omitted. As shown in FIG. 9A, the track 120 is fixed to the floor surface of the transport chamber 100, and the mobile buffer 110 moves on the track 120 of the floor surface, which is different from the transport system 1 shown in FIG. 3A.

Here, the mobile buffer 110 moves below the hand 12 (see FIG. 4) in the robot 10 to transfer the substrate W in the same manner as the transport system 1 shown in FIG. 3A. In addition, the first robot 10-1 is the double-arm robot 10C or the double-arm robot 10D shown in FIG. 6C or FIG. 6D, and the second robot 10-2 is the multi-degree of freedom robot 10B shown in FIG. 6B, as in the transport system 1 shown in FIG. 3A.

Although FIG. 9A shows the mobile buffer 110 arranged side by side, the multi-stage mobile buffer 110 shown in FIG. 8A may be used.

Next, the side shape of the transport system 1 shown in FIG. 9A will be described with reference to FIG. 9B. FIG. 9B is a side view schematically illustrating the transport system 1 according to a modification. As shown in FIG. 9B, the track 120 is different from the transport system 1 shown in FIG. 3B in that it is provided on the floor surface of the transport chamber 100.

Note that the substrate W placed on the mobile buffer 110 moves to a position higher than the robot 10 in the posture in which the hand 12 is lowered, as in the transport system 1 shown in FIG. 3B. As described above, even when the mobile buffer 110 is a floor-mounted type, interference with the robot 10 can be avoided by setting the placement position of the substrate W to a position higher than the robot 10 in the posture in which the hand 12 is lowered.

Next, the shape of the transport system 1 shown in FIG. 9A as viewed obliquely from above will be described with reference to FIG. 9C. FIG. 9C is a perspective view of the transport system 1. Although FIG. 9C corresponds to FIG. 3C, FIG. 3C shows a sidewall and a floor wall which are not shown.

As shown in FIG. 9C, it is different from the transport system 1 shown in FIG. 3C in that the two tracks 120 (the first track 120-1 and the second track 120-2) are fixed to the floor wall of the transport chamber 100. The first mobile buffer 110-1 is provided on the first track 120-1, and the second mobile buffer 110-2 is provided on the second track 120-2. Since the second track 120-2 is hidden by the sidewall, the description thereof is omitted.

Figure 10:
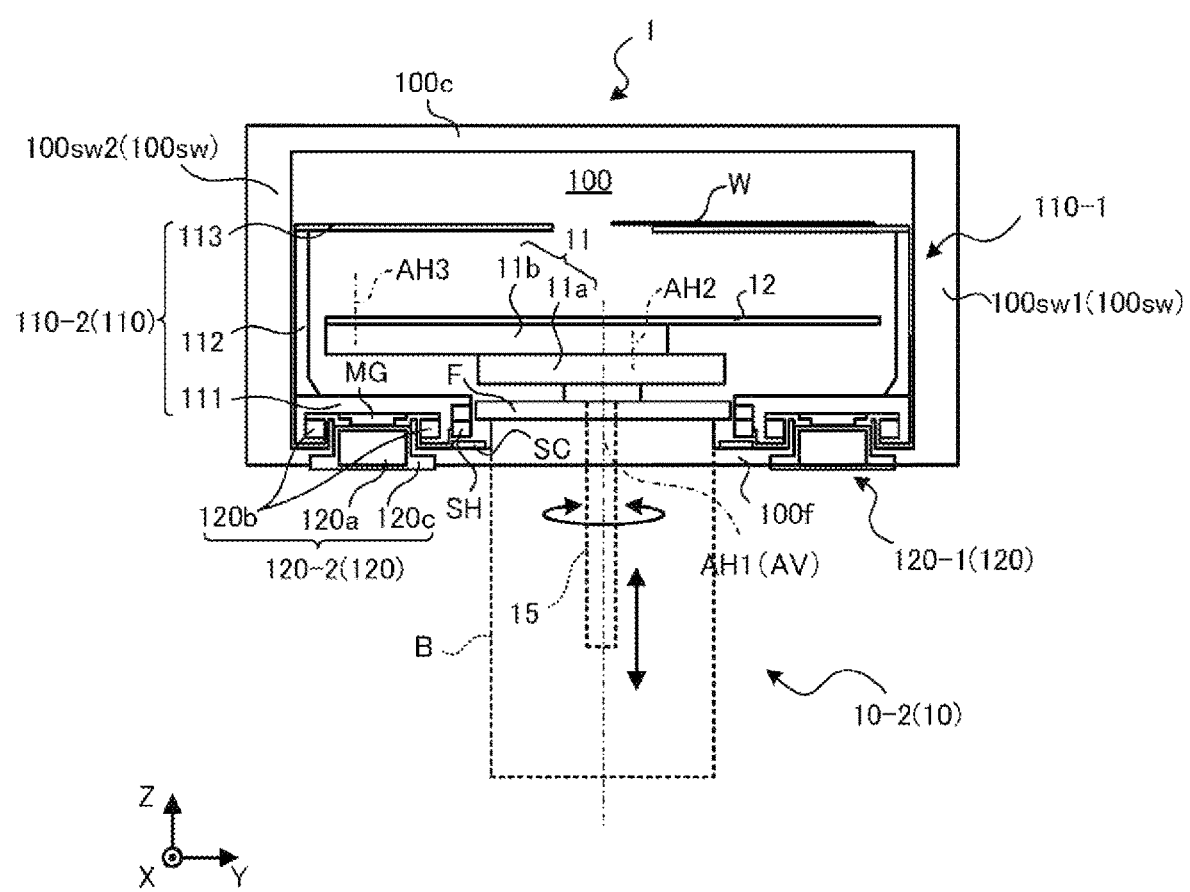
FIG. 10 is a schematic side view of the transport system of FIG. 9A.

Next, a configuration example of the robot 10 and the mobile buffer 110 will be described with reference to FIG. 10. FIG. 10 is a second schematic side view of the transport system 1 according to a modification. The configuration of the robot 10 is the same as that shown in FIG. 4. On the other hand, the mobile buffer 110 is different from the mobile buffer 110 shown in FIG. 4 in that the vertical orientation is reversed and the column 112 is lengthened so that the support position of the holding portion 113 is higher than the robot 10.

As shown in FIG. 10, the column 112 is longer than the column 112 shown in FIG. 4, and supports the holding portion 113 at a position higher than the robot 10.

As shown in FIG. 4, when the substrate W is held by the first mobile buffer 110-1, the robot 10 receives the substrate W by raising the hand 12. Conversely, when the substrate W is held by the hand 12, the robot 10 passes the substrate W to the mobile buffer 110 by lowering the hand 12 which has been raised to a position higher than the substrate W.

Figure 11:
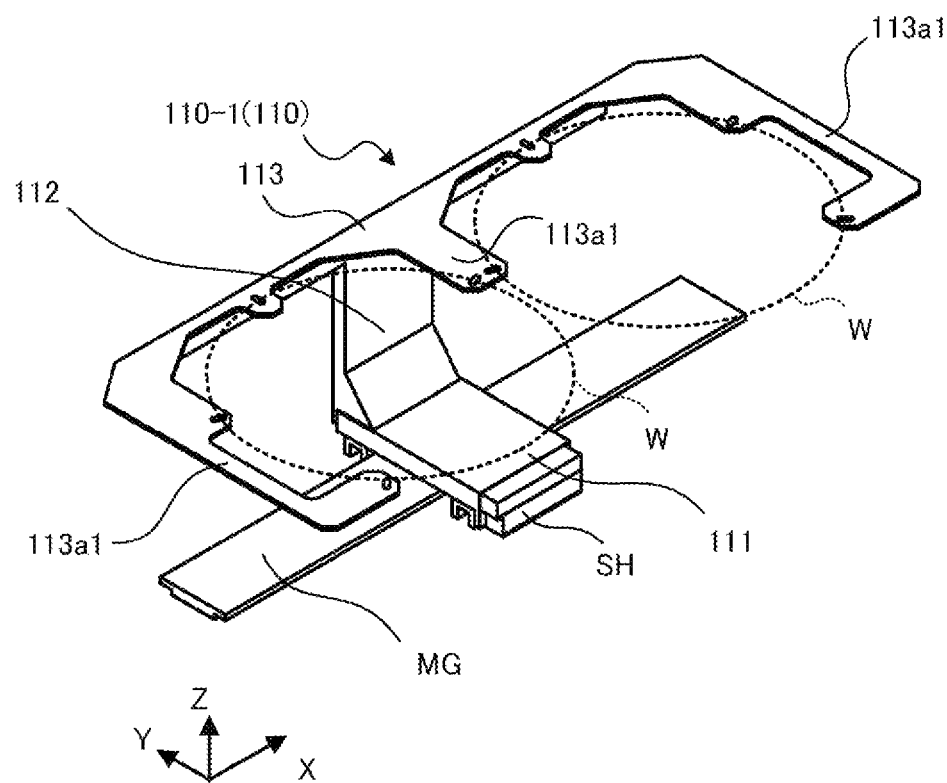
FIG. 11 is a perspective view of an example floor-mounted mobile buffer.

Next, the mobile buffer 110 shown in FIG. 10 will be described with reference to FIG. 11. FIG. 11 is a perspective view of a floor-mounted mobile buffer 110. FIG. 11 is a perspective view corresponding to FIG. 5A, but is different from the directional view of FIG. 5A in that the first mobile buffer 110-1 is viewed obliquely from above.

As shown in FIG. 11, the moving unit 111 supports the column 112 on the top surface side. The column 112 is connected to a position closer to the first sidewall 100sw1 (see FIG. 10) in the moving unit 111 and is outside the turning region 10rt of the robot 10 (see FIG. 1). Further, the holding portion 113 is supported by the column 112 at the proximal end side in a posture in which the distal end side is directed away from the first sidewall 100sw1.

As shown in FIG. 11, the mobile buffer 110 is similar to the mobile buffer 110 shown in FIG. 5A in that two substrates W can be held in a horizontal orientation along the moving direction, but it can be seen that there is a pad for supporting the substrate W on the top surface of the holding portion 113.

Figure 12:
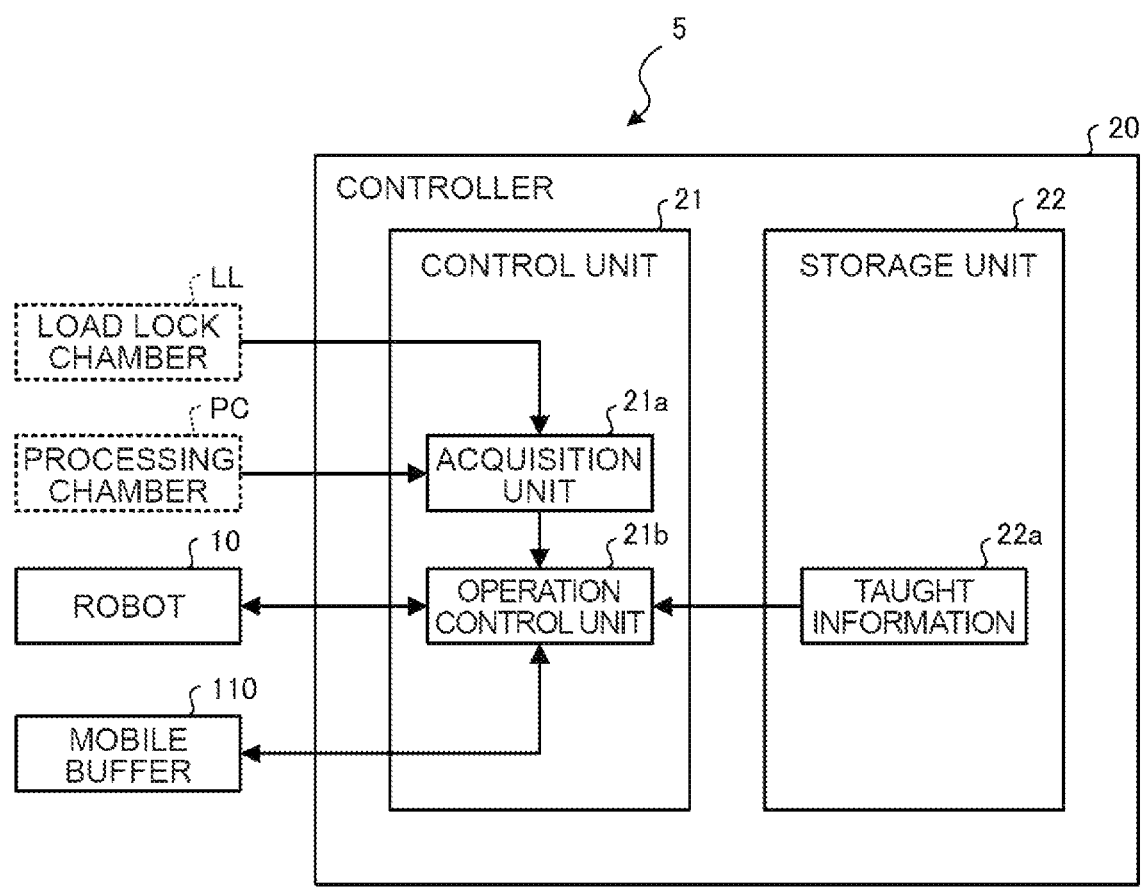
FIG. 12 is a block diagram illustrating an example configuration of a transport device.

Next, the configuration of the transport device 5 shown in FIG. 1 will be described with reference to FIG. 12. FIG. 12 is a block diagram showing the configuration of the transport device 5. As shown in FIG. 12, the transport device 5 includes the robot 10, the mobile buffer 110, and a controller 20. The robot 10 and the mobile buffer 110 are connected to the controller 20. The load lock chamber LL and the processing chamber PC are also connected to the controller 20 and can exchange information.

The controller 20 includes a control unit 21 and a storage unit 22. The control unit 21 includes an acquisition unit 21a and an operation control unit 21b. The storage unit 22 stores a taught information 22a. Although one controller 20 is shown in FIG. 12 to simplify the description, a plurality of controllers 20 may be used. In this case, a host controller that bundles the controllers may be provided. For example, a controller to which the robot 10 is connected and a controller to which the mobile buffer 110 is connected may be separated from each other, and a host controller that bundles the controllers may be provided.

The controller 20 may include, for example, a computer having a central processing unit (CPU), a read only memory (ROM), a random access memory (RAM), a hard disk drive (HDD), an input/output port, and the like, and various circuits. The CPU of the computer functions as the acquisition unit 21a and the operation control unit 21b of the control unit 21 by reading and executing a program stored in the ROM, for example.

At least one or all of the acquisition unit 21a and the operation control unit 21b may be configured by hardware such as an application specific integrated circuit (ASIC) or a field programmable gate array (FPGA).

The storage unit 22 corresponds to, for example, RANI or HDD. The RAM and the HDD can store the taught information 22a. The controller 20 may acquire the above-described program and various types of information via another computer or a portable recording medium connected via a wired or wireless network. Further, as described above, the controller 20 may be configured as a plurality of devices capable of communicating with each other, or may be configured as a hierarchical device capable of communicating with an upper or lower device.

The control unit 21 acquires trigger information such as an access request from the load lock chamber LL or the processing chamber PC, and controls operations of the robot 10 and the mobile buffer 110. When the controller 20 includes a plurality of units, the control unit 21 may also perform a process of synchronizing a plurality of the controller 20.

The acquisition unit 21a acquires trigger information such as an access request from the load lock chamber LL or the processing chamber PC. Then, the acquisition unit 21a determines operation timings and operation contents of the robot 10 and the mobile buffer 110 based on the acquired information, and notifies the operation control unit 21b of the determined operation timings and operation contents.

For example, the acquisition unit 21a acquires a timing at which the substrate W is carried into the load lock chamber LL from the outside, and instructs the operation control unit 21b to cooperatively operate the robot 10 and the mobile buffer 110 based on the acquired timing. In addition, the acquisition unit 21a acquires the timing at which the processing for the substrate W is completed from the processing chamber PC, and instructs the operation control unit 21b to operate the robot 10 and the mobile buffer 110 in a coordinated manner based on the acquired timing.

The operation control unit 21b operates the robot 10 and the mobile buffer 110 based on instructions from the acquisition unit 21a and the taught information 22a. Further, the operation control unit 21b performs feedback control while using an encoder value in an actuator such as a rotary motor or a linear motor as a power source of the robot 10 and the mobile buffer 110, thereby improving the operation accuracy of the robot 10 and the mobile buffer 110.

The taught information 22a is information which is created in a teaching stage for teaching operations to the robot 10 and the mobile buffer 110 and includes a program for defining an operation path of a robot or the like. As shown in FIG. 3A, when the robots are arranged at regular positions such as line-symmetric positions, taught data can be shared or reversed. Therefore, according to the transport device 5, the labor and cost for generating the taught information 22a including the taught data may be suppressed.

Figure 13A:
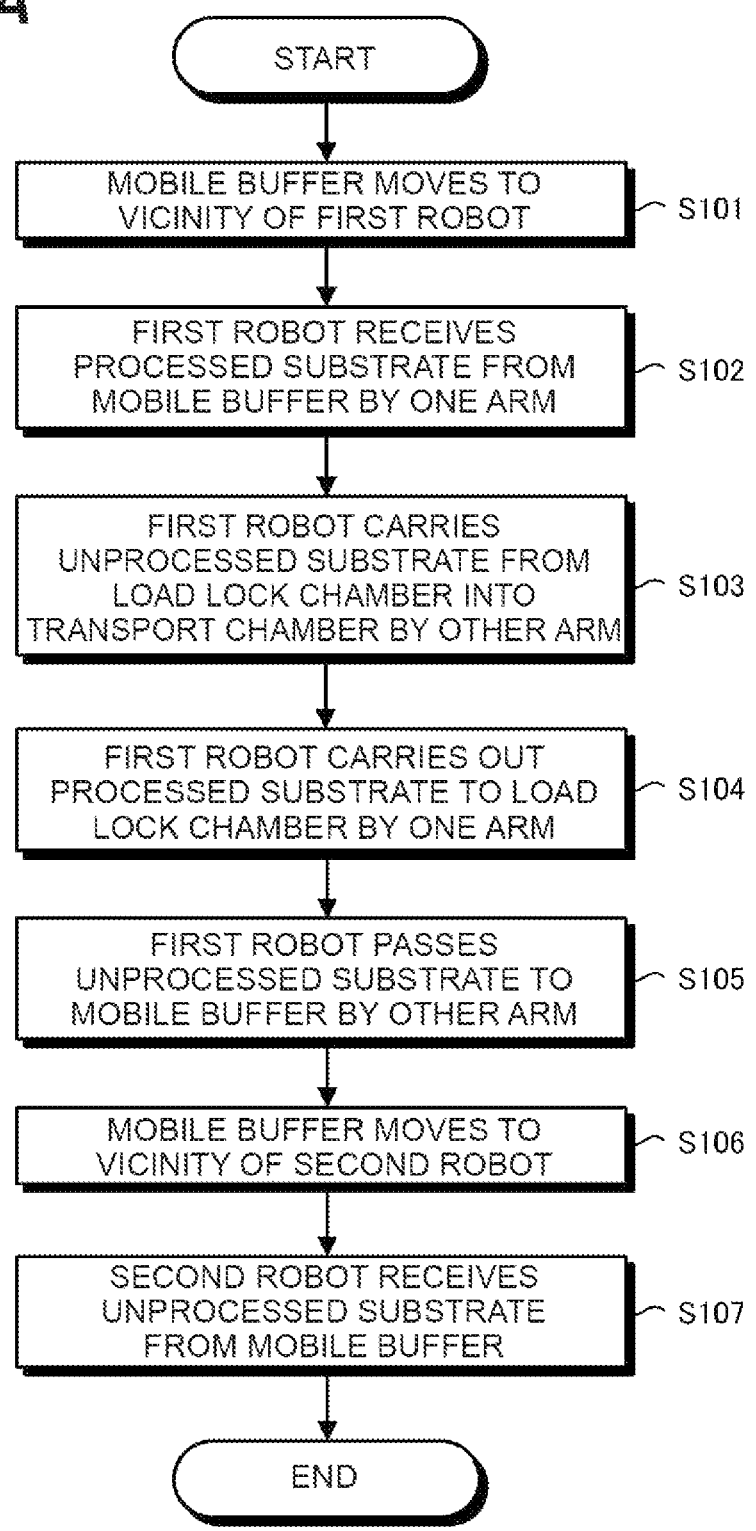
FIG. 13A is a first flowchart showing an example processing procedure executed by a transport device.
Figure 13B:
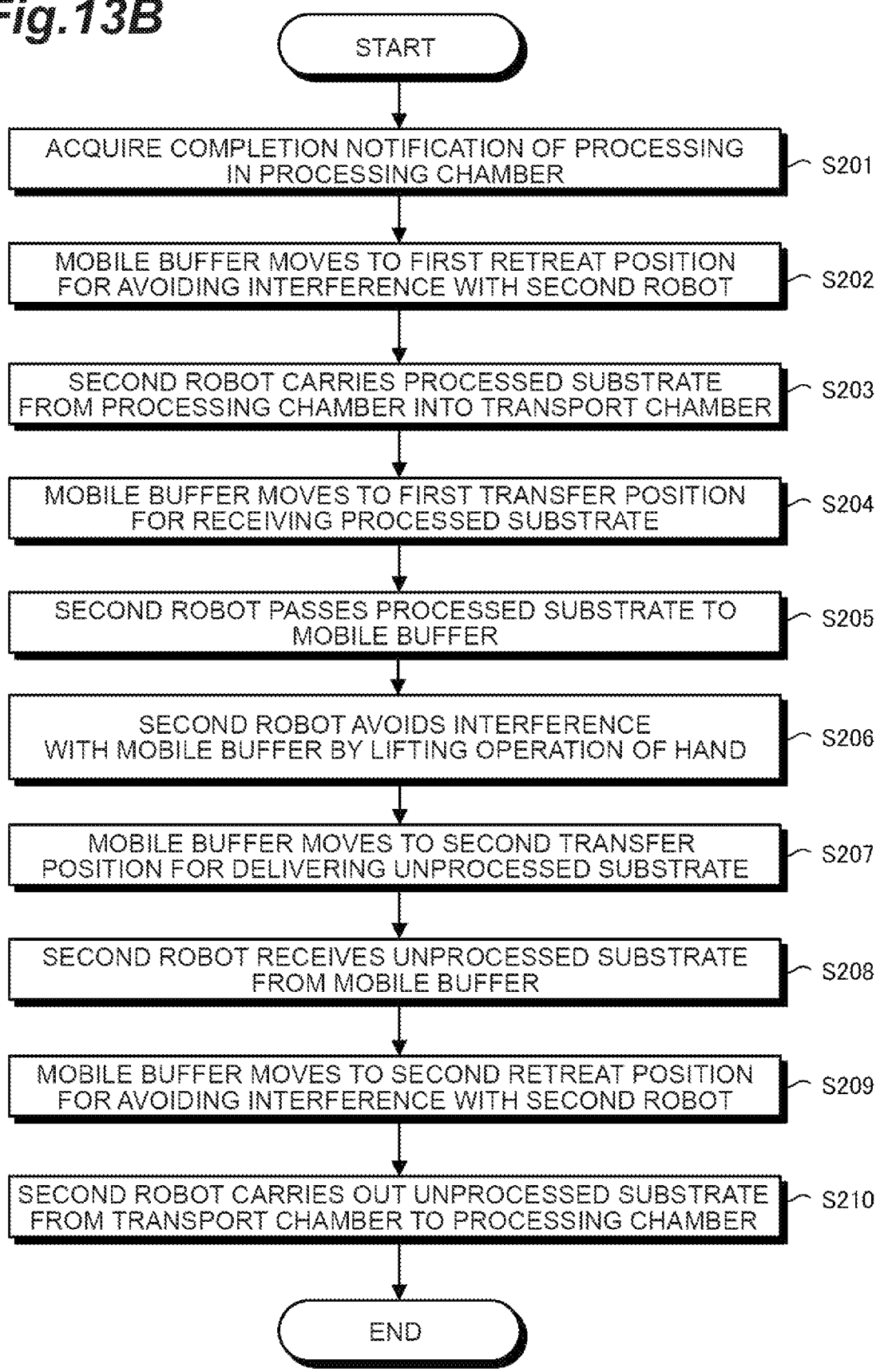
FIG. 13B is a second flowchart showing an example processing procedure executed by a transport device.

Next, an example of a processing procedure executed by the transport device 5 shown in FIG. 3A will be described with reference to FIGS. 13A and 13B. FIGS. 13A and 13B are a first flowchart and a second flowchart showing the processing procedure executed by the transport device 5. Note that FIG. 13A mainly shows the cooperative processing between the first robot 10-1 and the mobile buffer 110 shown in FIG. 3A, and FIG. 13B shows the cooperative processing between the second robot 10-2 and the mobile buffer 110.

First, FIG. 13A will be described. As shown in FIG. 13A, the mobile buffer 110 moves to the vicinity of the first robot 10-1 (operation S101). The first robot 10-1 receives (operation S102) the processed substrate W from the mobile buffer 110 in one arm (the first arm unit) and carries (operation S103) an unprocessed substrate W from the load lock chamber LL into the transport chamber 100 in the other arm (the second arm unit).

Further, the first robot 10-1 carries out a processed substrate W received from the mobile buffer 110 in the operation S102 to the load lock chamber by one arm (operation S104). Further, the first robot 10-1 transports the unprocessed substrate W received from the load lock chamber LL in the operation S103 to the mobile buffer 110 by the other arm (operation S105).

The mobile buffer 110 that has received the unprocessed substrate W moves to the vicinity of the second robot 10-2 (operation S106), and the second robot 10-2 receives the unprocessed substrate W from the mobile buffer 110 (operation S107) and ends the procedure.

Although FIG. 13A shows a case where each process is executed in series for understanding of the description, processes executable in parallel may be executed in parallel. Although FIG. 13A shows the case where the first robot 10-1 delivers the unprocessed substrate W to the second robot 10-2 via the mobile buffer 110, the first robot 10-1 may carry the unprocessed substrate W from the load lock chamber LL to the processing chamber PC.

Next, FIG. 13B will be described. In FIG. 13B, it is assumed that the unprocessed substrate W is placed in one of the placement positions in the mobile buffer 110, and the processing starts from a state in which the other of the placement positions is empty. As shown in FIG. 13B, when the acquisition unit 21a of the controller 20 acquires the processing completion notification of the substrate W in the processing chamber PC (operation S201), the mobile buffer 110 moves to the first retreat position avoiding interference with the second robot 10-2 (operation S202), and the second robot 10-2 carries the processed substrate W from the processing chamber PC into the transport chamber 100 (operation S203).

Subsequently, the mobile buffer 110 moves to a first transfer position for receiving the processed substrate W (operation S204). Then, the second robot 10-2 delivers the processed substrate W to the mobile buffer 110 (operation S205).

When the mobile buffer 110 moves from the first transfer position to the second transfer position, the second robot 10-2 avoids interference with the mobile buffer 110 by the lifting operation of the hand 12 (operation S206). That is, while the mobile buffer 110 is moving from the first transfer position to the second transfer position, the second robot 10-2 avoids interference with the mobile buffer 110 by the lifting and lowering operation of the hand 12 without changing the position or orientation of the hand 12 in top view.

When the mobile buffer 110 moves to the second transfer position to deliver the unprocessed substrate W (operation S207), the second robot 10-2 acquires the unprocessed substrate W from the mobile buffer 110 (operation S208). The mobile buffer 110 is moved to the second retreat position to avoid interference with the second robot 10-2 (operation S209), and the second robot 10-2 carries out the unprocessed substrate W from the transport chamber 100 to the processing chamber PC (operation S210), and ends the procedure.

The first transfer position and the second transfer position may be the same position or different positions. For example, when the mobile buffer 110 is the side-by-side buffer illustrated in FIG. 3A or the like, the first transfer position and the second transfer position may be shifted by the distance between the centers of the two substrate placement regions. When the mobile buffer 110 is the multi-stage buffer illustrated in FIG. 8A or the like, the first transfer position and the second transfer position may be the same position. The first retreat position and the second retreat position may be the same position or different positions.

Figure 14:
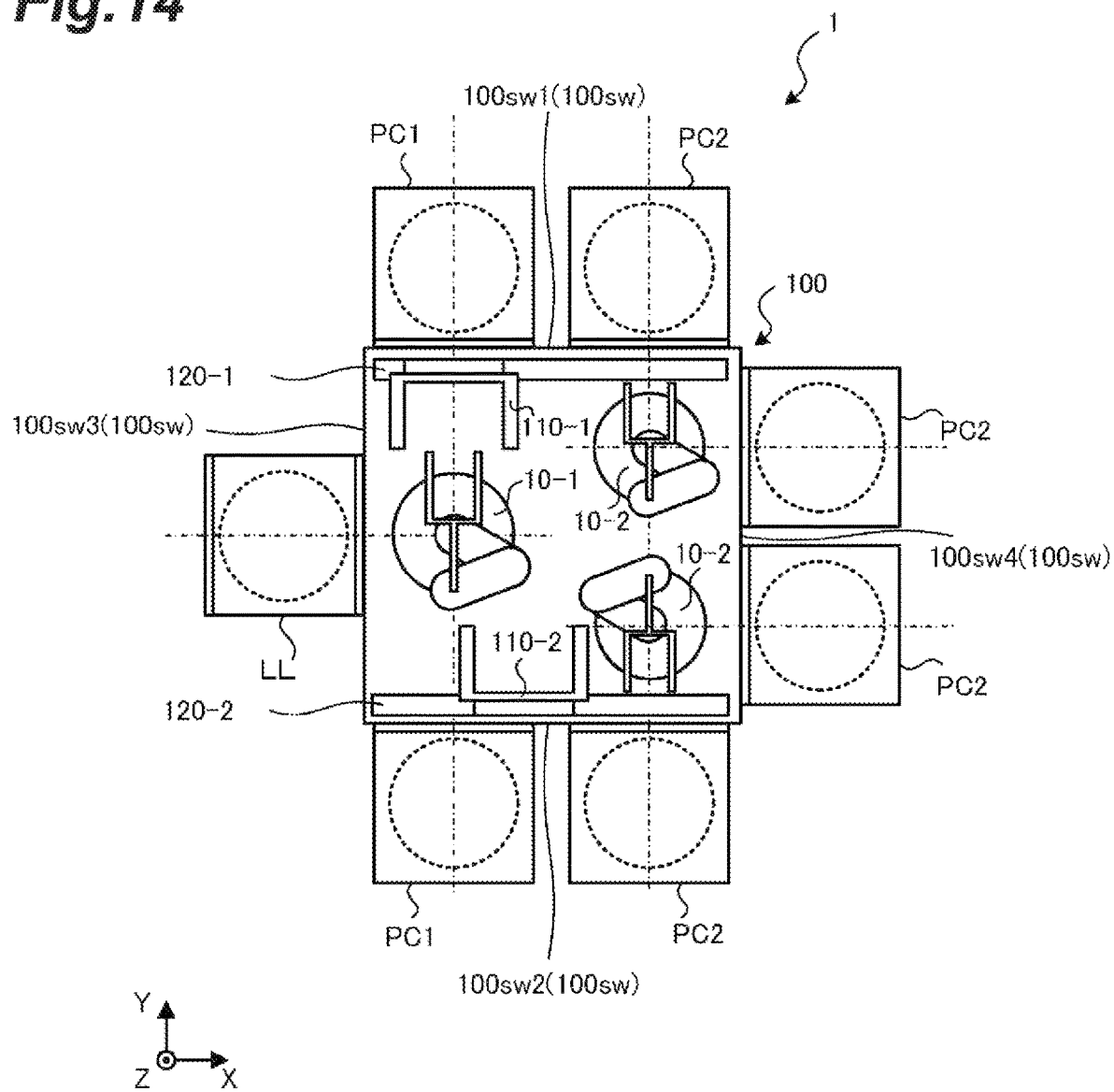
FIG. 14 is a schematic top view showing a first example robot arrangement.
Figure 15:
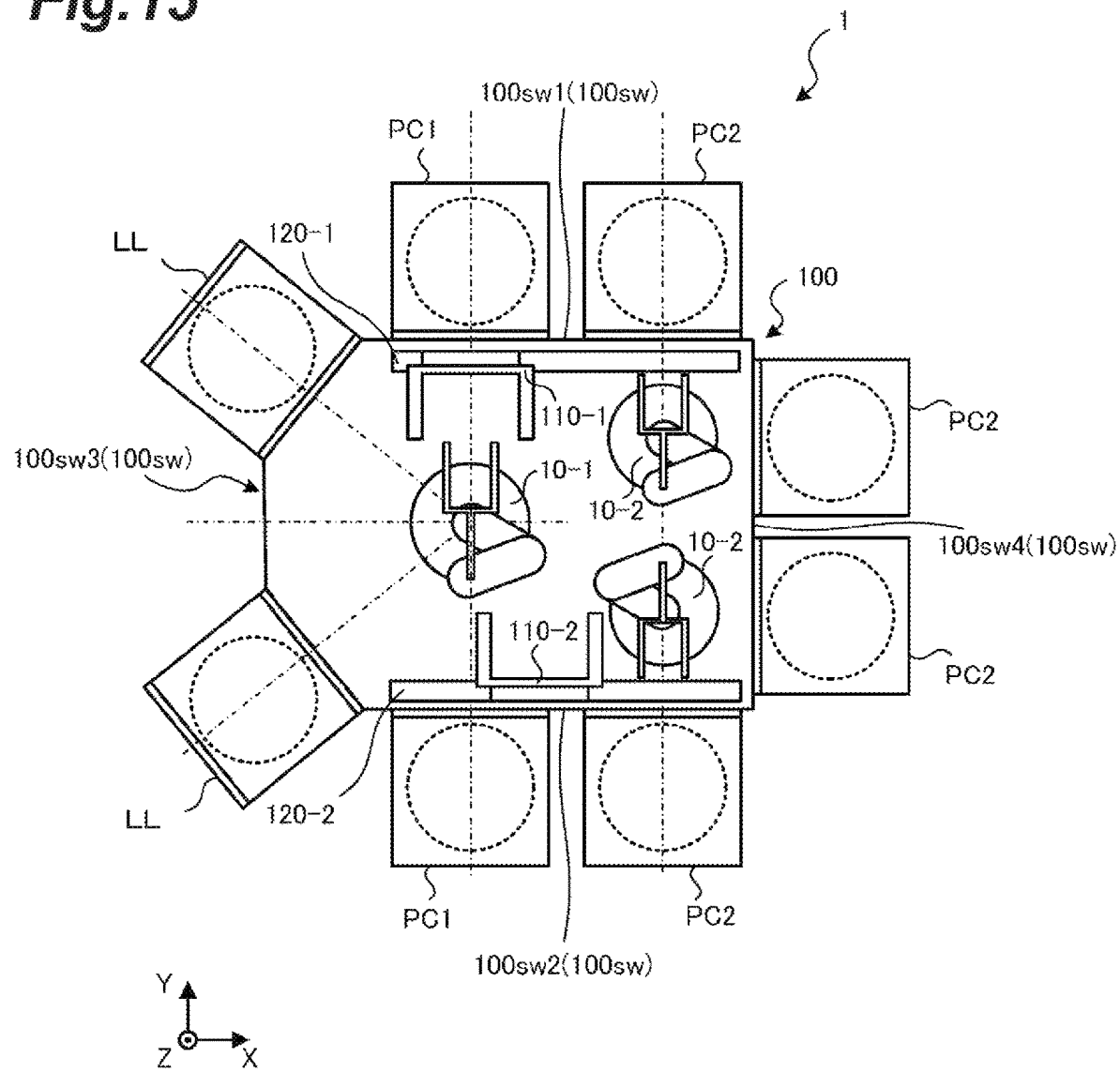
FIG. 15 is a schematic top view showing a second example robot arrangement.
Figure 16:
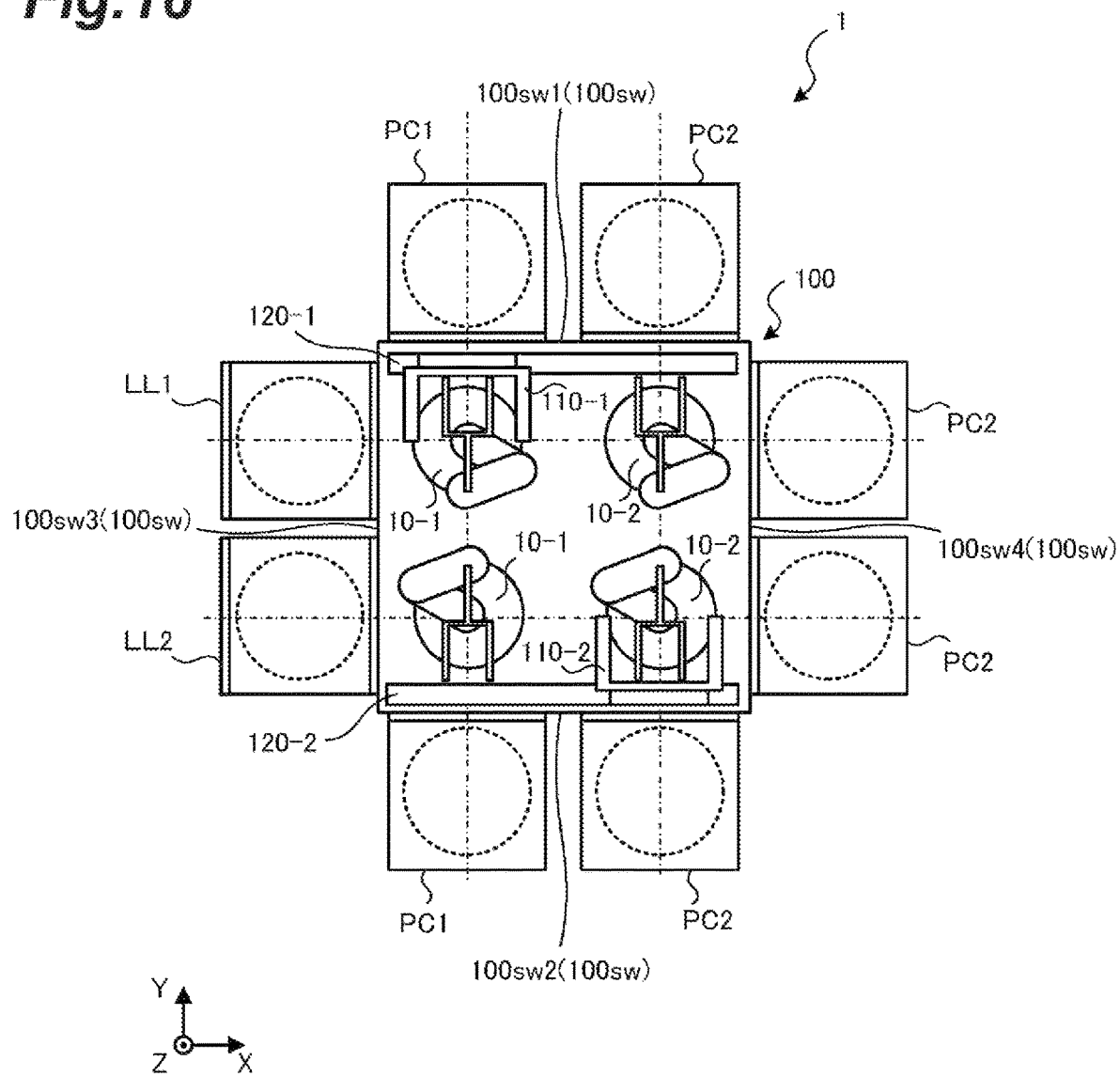
FIG. 16 is a schematic top view showing a third example robot arrangement.

Next, another example arrangement of the robot 10 in the transport chamber 100 will be described with reference to FIGS. 14 to 16. FIGS. 14 to 16 are schematic top views illustrating modifications 1 to 3 of the robot arrangement.

As shown in FIG. 14, in the transport system 1, two processing chambers PC are provided for each of the first sidewall 100$sw$1 and the second sidewall 100$sw$2. The two processing chambers PC and the two processing chambers PC face each other. The third sidewall 100$sw$3 is provided with one load lock chamber LL. The fourth sidewall 100$sw$4 is provided with the two processing chambers PC.

One first robot 10-1 are arranged on the third sidewall 100$sw$3 side of the transport chamber 100, and the two second robots 10-2 (the second robot and another robot) are arranged on the fourth sidewall 100$sw$4 side. Here, the first robot 10-1 is in front of the load lock chamber LL, the first processing chamber PC1 of the first sidewall 100$sw$1, and the first processing chamber PC1 of the second sidewall 100$sw$2. The two second robots are in front of the second processing chamber PC2 of the first sidewall 100$sw$1 and the second sidewall 100$sw$2.

Thus, the first sidewall 100$sw$1 and the second sidewall 100$sw$2 of the transport chamber 100 are provided with the opposing processing chambers PC, respectively. Each robot 10 (the first robot 10-1 and the second robot 10-2) transfers the substrate W to and from an opposing processing chamber PC. In the transport system 1, each robot 10, each mobile buffer 110, each processing chamber PC, and the load lock chamber LL are arranged so as to be symmetrical with respect to the symmetry line between the first sidewall 100$sw$1 and the second sidewall 100$sw$2.

In some examples, the first mobile buffer 110-1 is provided between each robot 10 and the first sidewall 100$sw$1, and the second mobile buffer 110-2 is provided between each robot 10 and the second sidewall 100$sw$2. That is, the first mobile buffer 110-1, the second robot 10-2 (the second robot position), the second robot 10-2 (the other robot position), and the second mobile buffer 110-2 are arranged in this order between the first sidewall 100$sw$1 and the second sidewall 100$sw$2 when viewed from the direction along the movement direction of the mobile buffer 110. Therefore, even if any one of the two mobile buffers 110 is stopped or any one of the two second robots 10-2 is stopped, the transportation of the substrate \V can be continued, so that the availability of the transportation of the substrate W can be increased.

Although FIG. 14 shows the case where one load lock chamber LL are provided in the third sidewall 100$sw$3 that is linear in a top view, a plurality of the load lock chambers LL may be provided on a radial line with respect to the turning center of the first robot 10-1. Therefore, a case where a plurality of the load lock chamber LL are provided in the third sidewall 100$sw$3 will be described below with reference to FIG. 15.

The transport system 1 shown in FIG. 15 is different from the transport system 1 shown in FIG. 14 in that the third sidewall 100$sw$3 has a shape bent toward the outside of the transport chamber 100 and the two load lock chambers LL is provided in the third sidewall 100*sw*3. Each load lock chamber LL is disposed in front of the first robot 10-1.

Therefore, the first robot 10-1 can access the two load lock chambers LL and the two first processing chambers PC1, respectively. Therefore, even if any one of the two load lock chambers LL is stopped, the transportation of the substrate W can be continued, so that the availability of the transportation of the substrate W can be increased. In some examples, each robot 10, each mobile buffer 110, each processing chamber PC, and each load lock chamber LL are arranged so that the transport system 1 is symmetrical with respect to the symmetry line between the first sidewall 100*sw*1 and the second sidewall 100*sw*2, which is similar to the transport system 1 shown in FIG. 14.

In FIGS. 14 and 15, the number of the first robot 10-1 accessing the load lock chamber LL is one, but the number of the first robot 10-1 may be two. Therefore, in the following example, a case where the number of the first robot 10-1 is two and a total of four robots 10 including the two second robots 10-2 are arranged in the transport chamber 100 will be described with reference to FIG. 16.

The transport system 1 shown in FIG. 16 has a square shape in a top view, and is symmetrical with respect to the symmetry line of the first sidewall 100*sw*1 and the second sidewall 100*sw*2 facing each other, and the symmetry line of the third sidewall 100*sw*3 and the fourth sidewall 100*sw*4 facing each other. Each of the two first robots 10-1 is arranged in front of the load lock chamber LL and the first processing chamber PC1. In addition, each of the two second robot 10-2 is arranged in front of the second processing chamber PC2.

In some examples, the first mobile buffer 110-1 is provided between each robot 10 and the first sidewall 100*sw*1, and the second mobile buffer 110-2 is provided between each robot 10 and the second sidewall 100*sw*2. As described above, in the transport system 1 shown in FIG. 16, since the transport paths of the substrate \V constitutes two systems on the first sidewall 100*sw*1 side and the second sidewall 100*sw*2 side, the availability of transport of the substrate W can be increased.

Even when the robot 10, the mobile buffer 110, the processing chamber PC, or the load lock chamber LL on either the first sidewall 100*sw*1 side or the second sidewall 100*sw*2 side is stopped, the processing of the substrate W can be continued. Therefore, the availability of the transport system 1 can be increased.

In some examples, as described above, the transport device 5 includes the plurality of robots 10 and the mobile buffer 110. The plurality of robots 10 is fixed in the chamber of the transport chamber 100 in a reduced-pressure atmosphere, and transports the substrate W. The transport chamber 100 includes the sidewall 100*sw*, and the sidewall 100*sw* includes the plurality of processing chambers PC arranged in a horizontal orientation. The mobile buffer 110 is configured to hold the substrate W and move along the track 120 along the arrangement direction of the plurality of processing chambers PC. The robot 10 includes the first robot 10-1 and the second robot 10-2. The first robot 10-1 is fixed at a position where the load lock chamber LL and the first processing chamber PC1 can be transferred with the substrate W. The first processing chamber PC1 is the processing chamber PC closest to the load lock chamber LL among the plurality of processing chambers PC. The second robot 10-2 is fixed at a position where the substrate W can be transferred with at least one second processing chamber PC2 different from the first processing chamber PC1 among the plurality of processing chambers PC. The mobile buffer 110 is configured to move between the sidewall 100*sw* and the robot 10 in the top view and pass through a position suitable for transferring the substrate W to and from the first robot 10-1 and a position suitable for transferring the substrate W to and from the second robot 10-2.

In some example transport devices, as described above, the robot is fixed, the substrate is placed in a mobile buffer, and the substrate is transported by the cooperative operation of the robot and the mobile buffer, so that the weight of the transport target can be reduced. As a result, the moving mechanism can be simplified and the operation rate of the moving mechanism is improved, so that the availability of the substrate transportation can be increased. Therefore, the substrate transport efficiency can be improved.

It is to be understood that not all aspects, advantages and features described herein may necessarily be achieved by, or included in, any one particular example. Indeed, having described and illustrated various examples herein, it should be apparent that other examples may be modified in arrangement and detail.

What is claimed is:

1. A transport device provided in a transport chamber having a reduced pressure atmosphere and including a first sidewall extending along an arrangement direction and a second sidewall facing toward the first sidewall, the transport device comprising:
   a first robot fixed at a first robot position in the transport chamber and configured to transfer a substrate to and from a first chamber provided outside the transport chamber;
   a second robot fixed at a second robot position in the transport chamber and configured to transfer the substrate to and from a second chamber provided outside the transport chamber on the first sidewall,
   wherein each of the first robot and the second robot comprises:
      a hand configured so that the substrate can be placed thereon; and
      an arm configured to move the hand by at least a rotating action without interfering with the first sidewall and the second sidewall;
   a mobile buffer comprising:
      a mover configured to be moved by an actuator along the arrangement direction at a fixed height;
      a column disposed on the mover; and
      a holding portion supported by the column to move along a movement locus extending along the arrangement direction and located between the first sidewall and each of the first robot position and the second robot position, and configured to hold the substrate in a horizontal orientation; and
   a lifter configured to vary a relative height between the mobile buffer and the hand,
   wherein the movement locus includes a first position for transferring the substrate to and from the first robot and a second position for transferring the substrate to and from the second robot, and
   wherein the mobile buffer and each of the first robot and the second robot are configured such that the hand does not interfere with the mobile buffer despite the relative height even when the hand is at a position for transferring the substrate to and from the mobile buffer.

2. The transport device according to claim 1,
   wherein the first chamber is provided outside the transport chamber on the first sidewall, and wherein the first robot is configured to transfer the substrate to and from the first chamber and an opposite side chamber provided outside the transport chamber on the second sidewall.

3. The transport device according to claim 1, wherein each of the first robot and the second robot is configured such that a circular region corresponding to a minimum turning radius of the hand and the arm around a rotation center of the rotating action, overlaps the movement locus of the mobile buffer in a top view.

4. The transport device according to claim 1, wherein the mobile buffer is configured such that the movement locus of the mobile buffer overlaps the hand facing the first sidewall in a top view.

5. The transport device according to claim 4, wherein the mobile buffer is configured to move below the hand carrying a processed substrate and to receive the processed substrate from the hand.

6. The transport device according to claim 1, wherein each of the first robot and the second robot is fixed such that a rotation center of the rotating action is located at an intermediate position between the first sidewall and the second sidewall in a top view.

7. The transport device according to claim 1, wherein a length of the hand of the second robot is greater than half distance between the first sidewall and the second sidewall, and less than the distance between the first sidewall and the second sidewall.

8. The transport device according to claim 1, wherein the column is positioned between the first sidewall and the movement locus, and
wherein the holding portion is supported by the column and extends away from the first sidewall to form a top surface for supporting the substrate.

9. The transport device according to claim 1, wherein the mobile buffer is configured to:
move to a first retreat position to avoid interference with a working hand which is the hand holding a processed substrate;
move from the first retreat position to a first transfer position to receive the processed substrate from the working hand, after the working hand moves into the transport chamber;
move to a second transfer position to deliver an unprocessed substrate to the working hand after receiving the processed substrate from the working hand, and
wherein the lifter is further configured to vary the relative height to avoid interference between the working hand and the mobile buffer while the mobile buffer moves from the first transfer position to the second transfer position.

10. The transport device according to claim 9, wherein the mobile buffer is configured to move, after the working hand receives the unprocessed substrate at the second transfer position, to a second retreat position to avoid interference with the working hand moving out from the transport chamber.

11. The transport device according to claim 10, wherein the lifter is further configured to raise and lower the working hand to change the relative height.

12. The transport device according to claim 1, wherein the first robot is a double-arm robot comprising:
a first arm unit including the hand and the arm; and
a second arm unit including a second hand and a second arm.

13. The transport device according to claim 12, wherein the first robot is configured to transfer a plurality of substrates to and from the first chamber by both the first arm unit and the second arm unit.

14. The transport device according to claim 13, wherein the first robot is configured to:
receive a processed substrate from the mobile buffer by the first arm unit;
load an unprocessed substrate from the first chamber into the transport chamber by the second arm unit;
unload the processed substrate to the first chamber by the first arm unit; and
transfer the unprocessed substrate to the mobile buffer by the second arm unit.

15. The transport device according to claim 1,
wherein the second robot is configured to transfer the substrate to and from the second chamber and an opposite side chamber provided outside the transport chamber on the second sidewall.

16. The transport device according to claim 15, further comprising a second mobile buffer configured to:
hold the substrate; and
move along a second movement locus extending along the arrangement direction and located between the second sidewall and each of the first robot position and the second robot position.

17. The transport device according to claim 16, further comprising another robot fixed at another robot position in the transport chamber and configured to transfer the substrate to and from the second mobile buffer,
wherein the mobile buffer, the second robot position, the other robot position, and the second mobile buffer are sequentially arranged in order from the first sidewall to the second sidewall when viewed from a direction along the arrangement direction.

18. The transport device according to claim 1, wherein the first sidewall is further provided with a third chamber that is adjacent to the second chamber along the arrangement direction, and
wherein the second robot is configured to transfer the substrate to and from the second chamber and the third chamber.

19. The transport device according to claim 18, wherein the second robot is configured to move the hand along the arrangement direction while keeping the hand facing the first sidewall in a top view.

20. The transport device according to claim 1, wherein the transport chamber further includes a top wall and a floor wall, and
wherein the actuator is fixed to the top wall or the floor wall.

21. The transport device according to claim 20, wherein the actuator is fixed to the top wall, and
wherein each of the first robot and the second robot is fixed to the floor wall.

22. The transport device according to claim 1, wherein the mobile buffer is configured to hold a plurality of substrates.

23. The transport device according to claim 22, wherein the mobile buffer is a side-by-side buffer configured to hold the plurality of substrates arranged along the arrangement direction.

24. The transport device according to claim 23, wherein the side-by-side buffer has:
two end supports arranged along the arrangement direction; and
a center support positioned between the two end supports along the arrangement direction, wherein each of the two end supports and the center support protrudes away from the first sidewall, and wherein the center support is shorter than the two end supports.

25. The transport device according to claim 22, wherein the mobile buffer is a multi-stage buffer configured to hold the plurality of substrates arranged along a vertical direction.

26. A method for conveying a substrate in a transport chamber having a reduced pressure atmosphere and including a first sidewall extending along an arrangement direction and a second sidewall facing toward the first sidewall, the method comprising:

loading the substrate, from a first chamber provided outside the transport chamber, into the transport chamber by a first robot fixed at a first robot position in the transport chamber;

moving a mobile buffer along a movement locus positioned between the first sidewall and the first robot position, to a receiving position;

varying, by a lifter, a relative height between the mobile buffer and a hand of the first robot;

transferring the substrate by the hand of the first robot to the mobile buffer positioned at the receiving position;

moving the mobile buffer holding the substrate along the movement locus from the receiving position to a delivering position;

varying, by the lifter, a relative height between the mobile buffer and a hand of a second robot;

receiving the substrate by the hand of the second robot fixed at a second robot position in the transport chamber, from the mobile buffer positioned at the delivering position, wherein the movement locus is positioned between the first sidewall and the second robot position; and transferring the substrate by the second robot from the transport chamber to a second chamber provided outside the transport chamber on the first sidewall, wherein each of the first robot and the second robot comprises an arm configured to move the hand by at least a rotating action without interfering with the first sidewall and the second sidewall, wherein the mobile buffer comprises:

a mover configured to be moved by an actuator along the arrangement direction at a fixed height;

a column disposed on the mover; and a holding portion supported by the column to move along the movement locus extending along the arrangement direction and located between the first sidewall and each of the first robot position and the second robot position, and configured to hold the substrate in a horizontal orientation, and wherein the mobile buffer and each of the first robot and the second robot are configured such that the hand does not interfere with the mobile buffer despite the relative height between the mobile buffer and the hand, even when the hand is at a position for transferring the substrate to and from the mobile buffer.

27. The method according to claim 26, wherein the method further comprises:

transferring the substrate by the first robot from the transport chamber to another chamber provided outside the transport chamber on the first sidewall.

28. A transport system comprising:

a transport chamber having a reduced pressure atmosphere, and including a first sidewall extending along an arrangement direction and a second sidewall facing toward the first sidewall;

a first robot fixed at a first robot position in the transport chamber and configured to transfer a substrate to and from a first chamber provided outside the transport chamber;

a second robot fixed at a second robot position in the transport chamber and configured to transfer the substrate to and from a second chamber provided outside the transport chamber on the first sidewall, wherein each of the first robot and the second robot comprises:

a hand configured so that the substrate can be placed thereon; and an arm configured to move the hand by at least a rotating action without interfering with the first sidewall and the second sidewall;

a mobile buffer comprising:

a mover configured to be moved by an actuator along the arrangement direction at a fixed height;

a column disposed on the mover; and a holding portion supported by the column to move on a movement locus extending along the arrangement direction and located between the first sidewall and each of the first robot position and the second robot position, and configured to hold the substrate in a horizontal orientation; and a lifter configured to vary a relative height between the mobile buffer and the hand, wherein the movement locus includes a first position for transferring the substrate to and from the first robot and a second position for transferring the substrate to and from the second robot, and wherein the mobile buffer and each of the first robot and the second robot are configured such that the hand does not interfere with the mobile buffer despite the relative height even when the hand is at a position for transferring the substrate to and from the mobile buffer.

* * * * *